US010371129B2

(12) United States Patent
Koyama et al.

(10) Patent No.: US 10,371,129 B2
(45) Date of Patent: Aug. 6, 2019

(54) SEMICONDUCTOR DEVICE AND SENSOR SYSTEM

(71) Applicant: Semiconductor Energy Laboratory Co., Ltd., Atsugi-shi, Kanagawa-ken (JP)

(72) Inventors: Jun Koyama, Sagamihara (JP); Sho Nagao, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 160 days.

(21) Appl. No.: 15/431,015

(22) Filed: Feb. 13, 2017

(65) Prior Publication Data

US 2017/0248128 A1    Aug. 31, 2017

(30) Foreign Application Priority Data

Feb. 26, 2016    (JP) ................................. 2016-035307

(51) Int. Cl.
*F03G 7/08*    (2006.01)
*H01L 27/105*    (2006.01)
*H01L 29/786*    (2006.01)

(52) U.S. Cl.
CPC ............ *F03G 7/08* (2013.01); *H01L 27/1052* (2013.01); *H01L 29/7869* (2013.01)

(58) Field of Classification Search
CPC .......... G01N 33/00; H01L 2924/00014; H01L 2924/00; A61L 27/48; C04B 2103/54
USPC ...................................................... 73/865.8
See application file for complete search history.

(56) References Cited

U.S. PATENT DOCUMENTS

| 5,744,864 A | * | 4/1998 | Cillessen | G02F 1/1368 257/59 |
| 5,847,410 A | * | 12/1998 | Nakajima | G02F 1/13439 257/59 |
| 7,776,749 B2 | * | 8/2010 | Mouli | G02B 6/10 216/2 |
| 9,461,646 B2 | | 10/2016 | Kozuma et al. | |
| 2006/0069455 A1 | | 3/2006 | Longsdorf et al. | |
| 2007/0229271 A1 | * | 10/2007 | Shionoiri | G06K 7/10178 340/572.1 |

(Continued)

FOREIGN PATENT DOCUMENTS

EP    1803041 A    7/2007
JP    11-505377    5/1999

(Continued)

OTHER PUBLICATIONS

International Search Report (Application No. PCT/IB2017/050802) dated May 16, 2017.

(Continued)

*Primary Examiner* — Peter J Macchiarolo
*Assistant Examiner* — Mohammed E Keramet-Amircola
(74) *Attorney, Agent, or Firm* — Robinson Intellectual Property Law Office; Eric J. Robinson

(57) ABSTRACT

A sensor system that does not require wiring connection is provided. The sensor system includes a power generator, a power storage device, a wireless device, a sensing device, and a power switch (PSW). Data is transmitted and received wirelessly. Energy harvesting with vibration or the like is used as a power source, and supply of power to an unused portion of the PSW is stopped.

18 Claims, 23 Drawing Sheets

(56) References Cited

U.S. PATENT DOCUMENTS

| | | | |
|---|---|---|---|
| 2008/0073658 A1* | 3/2008 | Wirth | H01L 33/145 257/96 |
| 2009/0085182 A1* | 4/2009 | Yamazaki | H01L 23/295 257/679 |
| 2009/0195359 A1* | 8/2009 | Koyama | G06K 19/0723 340/10.1 |
| 2010/0163868 A1* | 7/2010 | Yamazaki | H01L 27/1225 257/43 |
| 2011/0084337 A1* | 4/2011 | Yamazaki | H01L 27/124 257/347 |
| 2011/0089975 A1* | 4/2011 | Yamazaki | H01L 27/1225 326/102 |
| 2011/0109351 A1* | 5/2011 | Yamazaki | H01L 27/1225 327/109 |
| 2011/0187688 A1* | 8/2011 | Yamazaki | H01Q 1/2258 345/208 |
| 2013/0062607 A1* | 3/2013 | Yamazaki | H01L 27/1225 257/59 |
| 2014/0173300 A1* | 6/2014 | Yamazaki | H02J 7/0004 713/300 |
| 2014/0184165 A1* | 7/2014 | Takahashi | H01M 10/48 320/134 |
| 2016/0094079 A1 | 3/2016 | Hiroki et al. | |

FOREIGN PATENT DOCUMENTS

| | | |
|---|---|---|
| JP | 2001-237760 A | 8/2001 |
| JP | 2008-515098 | 5/2008 |
| JP | 2012-206630 A | 10/2012 |
| JP | 2014-063480 A | 4/2014 |
| JP | 2015-132776 A | 7/2015 |
| WO | WO-2006/039170 | 4/2006 |

OTHER PUBLICATIONS

Written Opinion (Application No. PCT/IB2017/050802) dated May 16, 2017.

* cited by examiner (normal operation)

(back up operation)

(restore operation)

FIG. 15A
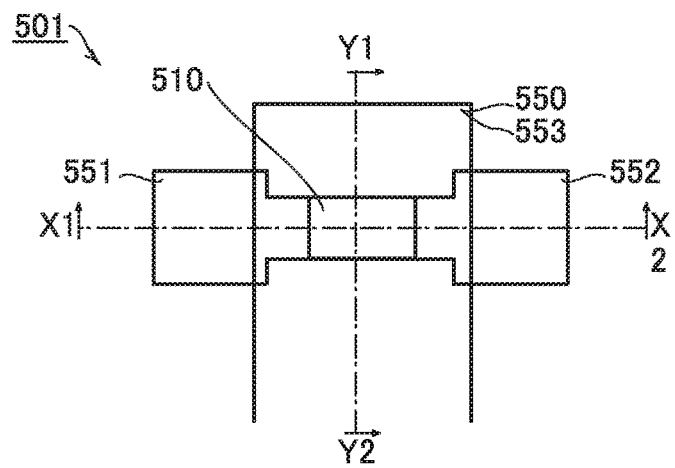
FIG. 15B
FIG. 15C
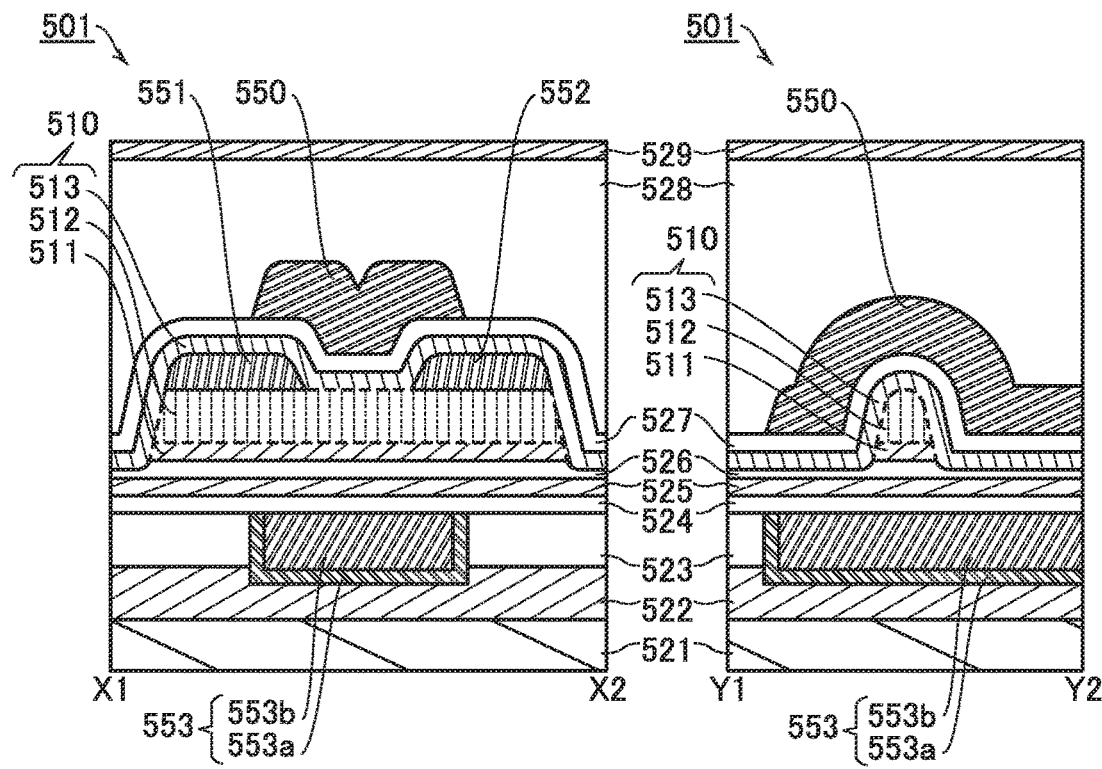

FIG. 16A
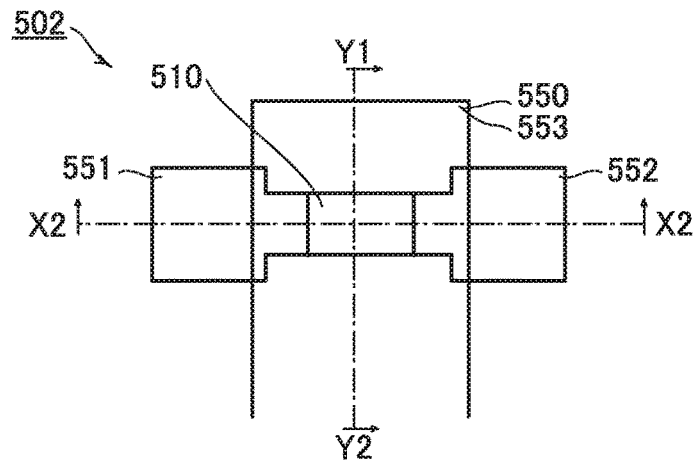
FIG. 16B
FIG. 16C
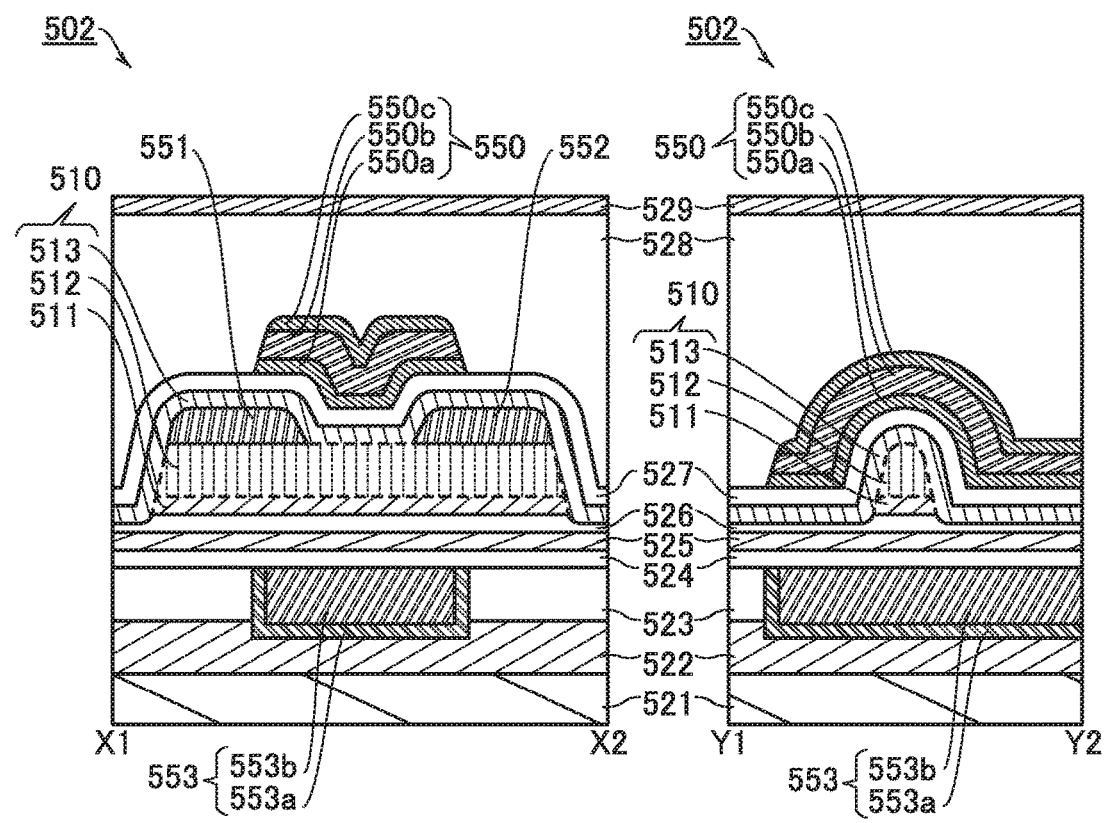

FIG. 17A
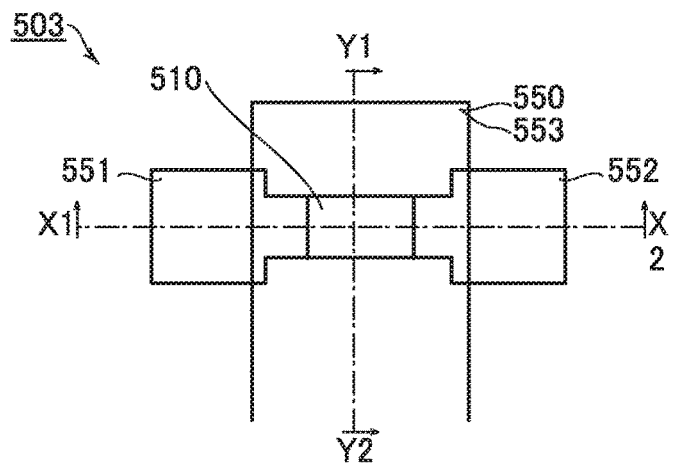
FIG. 17B
FIG. 17C
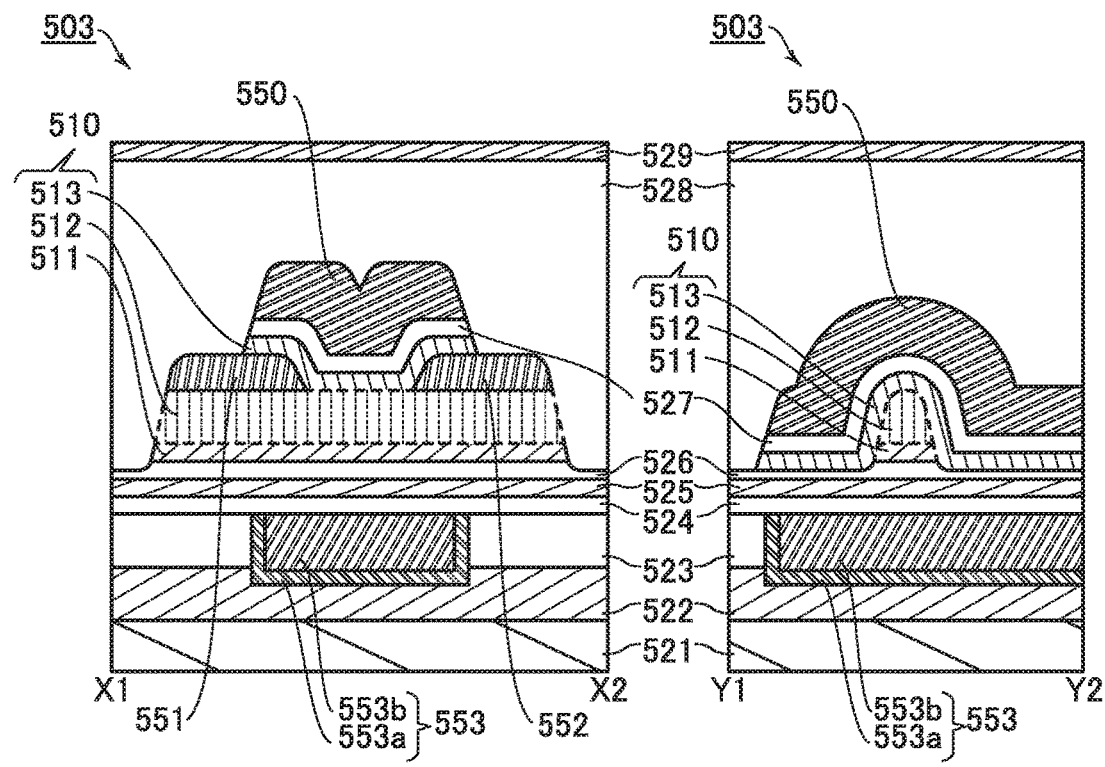

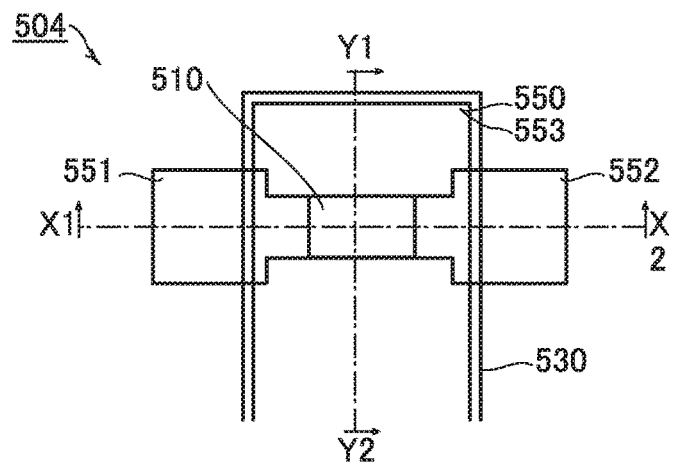
FIG. 18A
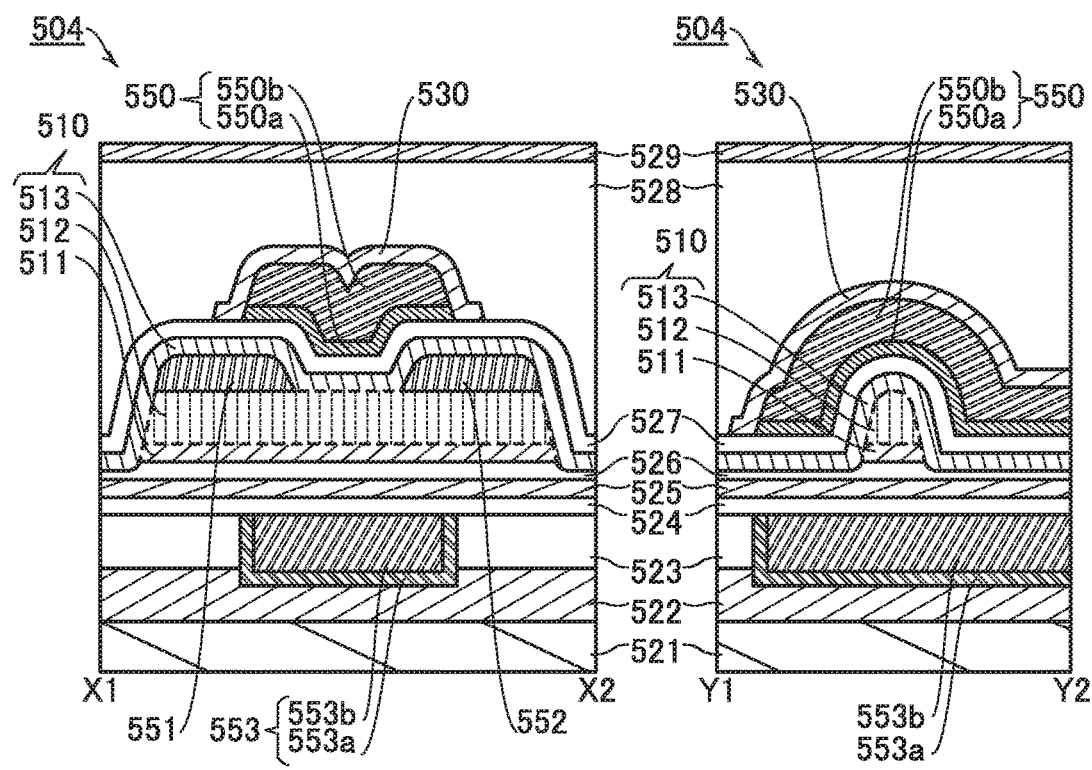
FIG. 18B
FIG. 18C

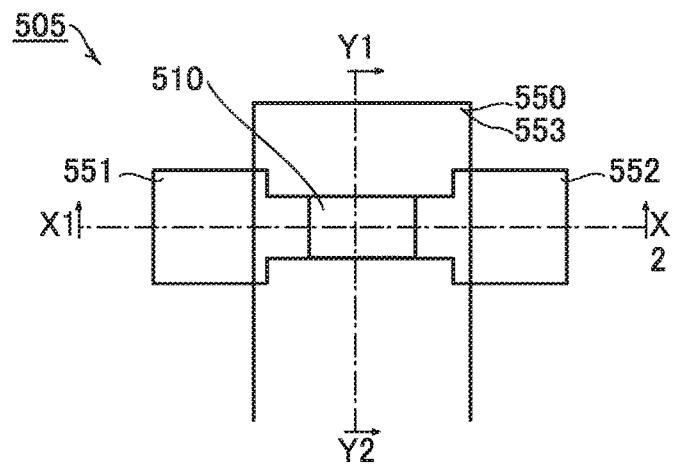
FIG. 19A
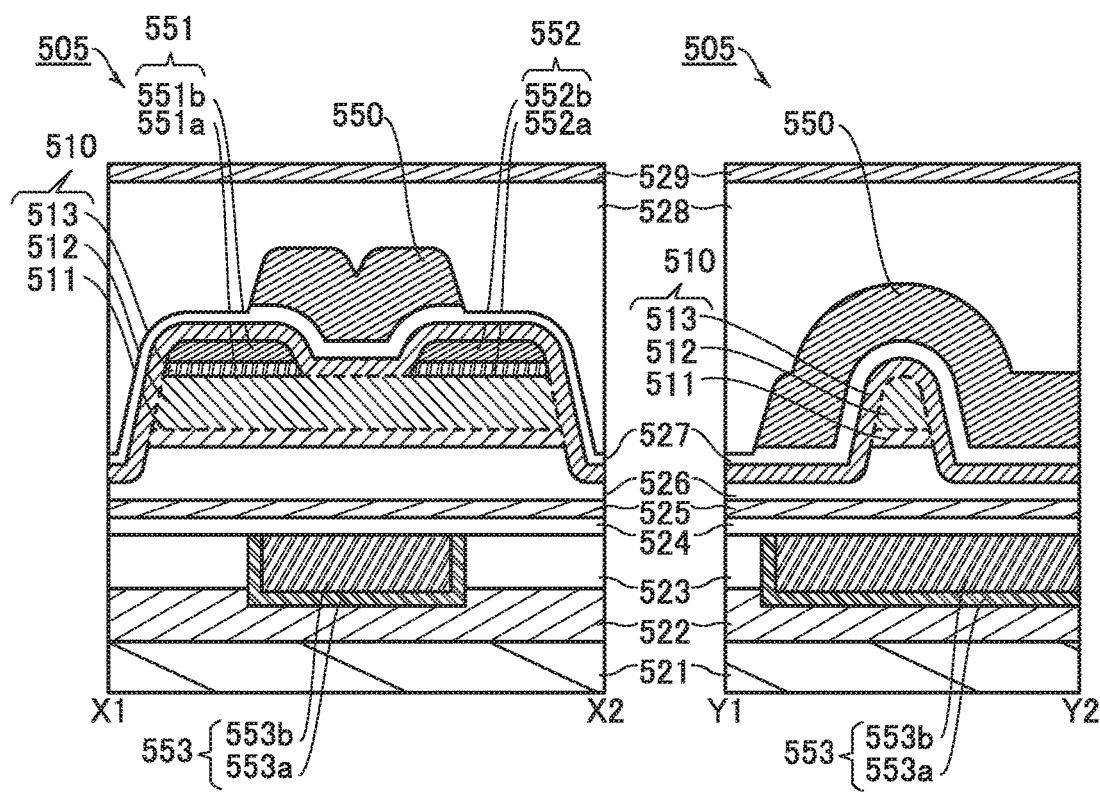
FIG. 19B
FIG. 19C

FIG. 20A
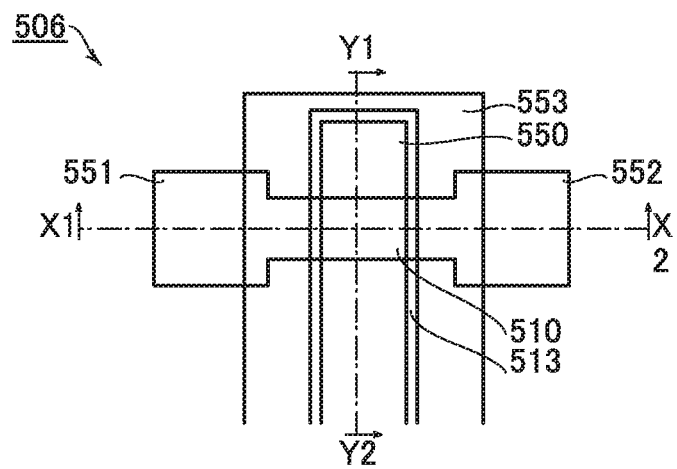
FIG. 20B
FIG. 20C
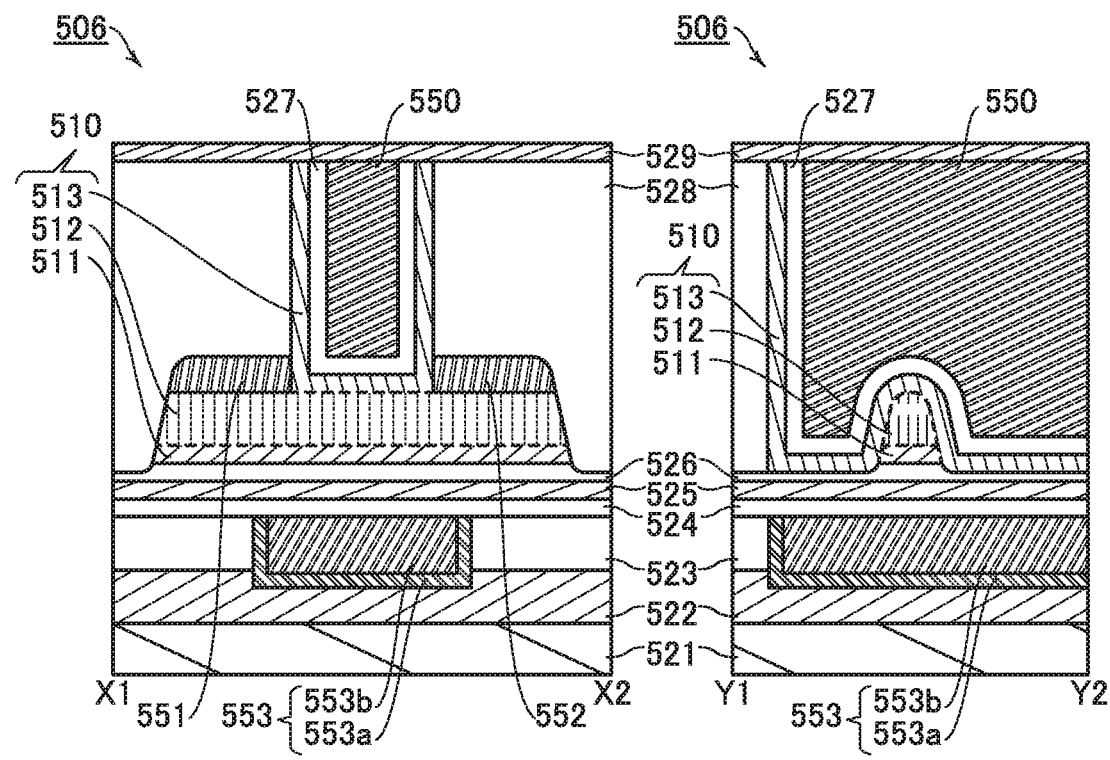

FIG. 21A
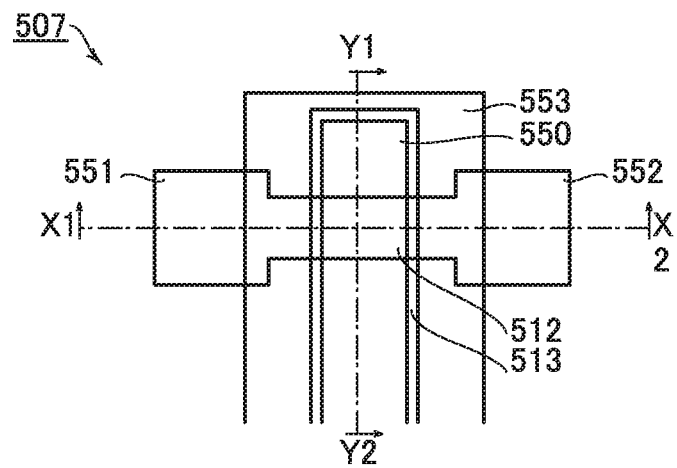
FIG. 21B
FIG. 21C
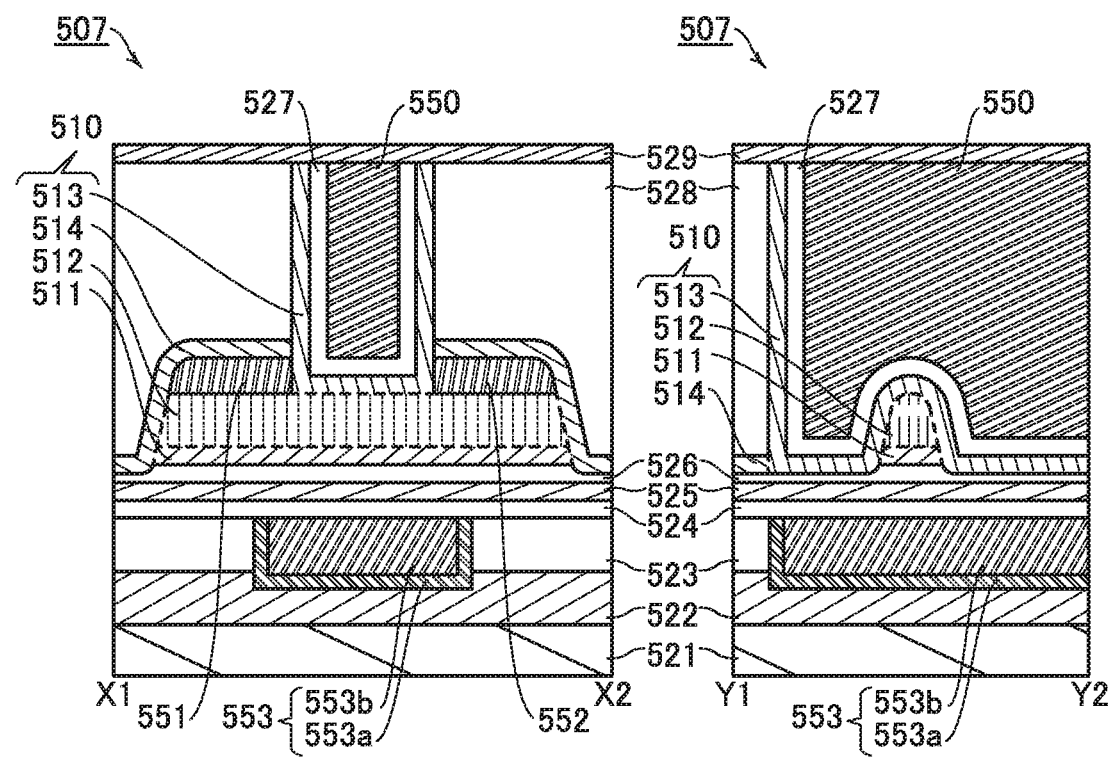

SEMICONDUCTOR DEVICE AND SENSOR SYSTEM

TECHNICAL FIELD

One embodiment of the present invention relates to a semiconductor device or a sensor system.

Note that one embodiment of the present invention is not limited to the above technical field. The technical field of the invention disclosed in this specification and the like relates to an object, a method, or a manufacturing method. Another embodiment of the present invention relates to a process, a machine, manufacture, or a composition of matter. Specifically, examples of the technical field of one embodiment of the present invention disclosed in this specification include a semiconductor device, a power generator, a power storage device, a storage device, a CPU, a wireless device, a power switch (PSW), a timer, a display device, an electronic device, a method for driving any of them, a method for manufacturing any of them, a method for testing any of them, and a system including any of them.

BACKGROUND ART

In general, a refrigeration-type refrigerated transport service and a freezing-type refrigerated transport service are used as refrigerated transport services. With each refrigerated transport service, a package is distributed in an environment where a predetermined temperature zone is maintained. The environment means a cold-insulation box, a refrigerator car, a refrigerator truck, a cold-insulation container, or the like that includes one or more sensors for controlling the environment. A refrigerator or a freezer fixed to the cold-insulation box or the like adjusts its output based on output (data) from the sensor so that the predetermined temperature zone can be maintained.

A sensor is also used in an air conditioner that creates a car environment of a motor vehicle. The air conditioner of the motor vehicle controls a plurality of items such as capability of air-conditioning or heating, a vent to be used, and wind strength based on output (data) from the sensor so that the temperature of the motor vehicle can be set to temperature determined by a user of the motor vehicle. Moreover, in an expensive motor vehicle, controlling individual seats at different temperatures for individual passengers is becoming more common.

One of the methods that have been proposed to achieve higher performance, such as a reduction in power consumption of a semiconductor device and miniaturization, is the use of an oxide semiconductor for a semiconductor layer (hereinafter also referred to as an active layer, a channel layer, or a channel formation region in some cases) of a transistor in a semiconductor device. An example of the transistor includes an oxide of indium, gallium, and zinc (hereinafter also referred to as an In—Ga—Zn oxide in some cases) for a channel layer (see Patent Document 1).

REFERENCE

Patent Document

Patent Document 1: Japanese Translation of PCT International Application No. H11-505377

DISCLOSURE OF INVENTION

As an example of a refrigerated transport service, a method for maintaining the temperature of an inside of a cold-insulation box, a refrigerator car, a refrigerator truck, a cold-insulation container, or the like to be a predetermined temperature zone by using one or more sensors has been developed; however, a package is treated in outside air at the timing of transshipment of the package or timing of sorting, for example. In other words, the package is not always in the predetermined temperature zone through the refrigerated transport service, and it is necessary to put a sensor on each package to check the environment of the package.

In order to achieve a comfortable space inside a motor vehicle, it is necessary to provide a plurality of sensors for an air conditioner of the motor vehicle; however, in general, power is supplied from a battery of the motor vehicle to these sensors. If the number of sensors is increased to achieve a more comfortable environment and perform more accurate control, the number of metal wirings from the battery of the motor vehicle is increased, and arrangement of the sensors becomes complicated. There is also a method for using a primary battery or a secondary battery as a power source of the sensor; however, regular replacement of the primary battery or charging of the secondary battery is needed.

In view of the above problems, an object of one embodiment of the present invention is to provide a semiconductor device that does not require power supply through a wiring, replacement of a primary battery, or charging of a secondary battery. Another object of one embodiment of the present invention is to provide a semiconductor device that can collect data by sensing even when power cannot be generated. Another object of one embodiment of the present invention is to provide a low-power semiconductor device.

Another object of one embodiment of the present invention is to provide a novel semiconductor device. Another object of one embodiment of the present invention is to provide a module including the novel semiconductor device. Another object of one embodiment of the present invention is to provide an electronic device using the module including the novel semiconductor device. Another object of one embodiment of the present invention is to provide a novel semiconductor device, a novel storage device, a novel module, a novel electronic device, a novel system, or the like.

Note that the description of a plurality of objects does not disturb the existence of each object. One embodiment of the present invention does not necessarily achieve all the objects described above. Other objects will be apparent from and can be derived from the description of the specification, the drawings, the claims, and the like, and such objects could be objects of one embodiment of the present invention.

One embodiment of the present invention is a semiconductor device that includes a power generator, a power storage device, a wireless device, a sensing device, a sensing device controller, a power switch (PSW), a PSW controller, and a timer. The PSW and the PSW controller have a function of powering off the sensing device controller when sensing is not performed. Data obtained by the sensing device is transmitted through the wireless device, and power generated in the power generator is used.

In the semiconductor device, the power generator is preferably a vibration power generator.

In the semiconductor device, it is preferable to power off the timer during sensing.

The semiconductor device preferably includes an analog-digital converter circuit.

The semiconductor device preferably includes a nonvolatile memory, and the PSW and the PSW controller preferably power off the nonvolatile memory when sensing is not performed.

In the semiconductor device, the nonvolatile memory preferably includes a transistor whose channel formation region includes an oxide semiconductor.

The semiconductor device preferably includes a CPU, and the PSW and the PSW controller preferably power off the CPU when sensing is not performed.

In the semiconductor device, the CPU preferably includes a transistor whose channel formation region includes an oxide semiconductor.

The semiconductor device preferably includes an image display device.

In the semiconductor device, the image display device is preferably a reflective display.

One embodiment of the present invention is a vehicle including the semiconductor device.

One embodiment of the present invention is a sensor system that uses the semiconductor device and obtains at least one of temperature, humidity, atmospheric pressure, a light wavelength, light quantity, acceleration, and a gas concentration by the sensing device.

In the sensor system, it is preferable that the data obtainment and storage of the obtained data be repeated and that a plurality of pieces of the stored data be transmitted simultaneously.

According to one embodiment of the present invention, a semiconductor device that does not require power supply through a wiring, replacement of a primary battery, or charging of a secondary battery can be provided. According to another embodiment of the present invention, it is possible to provide a semiconductor device that can collect data by sensing even when power cannot be generated in a vibration power generator without vibration. According to another embodiment of the present invention, a low-power semiconductor device can be provided.

According to another embodiment of the present invention, a novel semiconductor device can be provided. According to another embodiment of the present invention, a module including the novel semiconductor device can be provided. According to another embodiment of the present invention, an electronic device using the module including the novel semiconductor device can be provided. According to another embodiment of the present invention, a novel semiconductor device, a novel storage device, a novel module, a novel electronic device, a novel system, or the like can be provided.

Note that the effects of one embodiment of the present invention are not limited to the above effects. The above effects do not disturb the existence of other effects. The other effects are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the above effects in some cases.

BRIEF DESCRIPTION OF DRAWINGS

In the accompanying drawings:

FIGS. 15A to 15C are a top view and cross-sectional views illustrating a structure example of an OS transistor;

FIGS. 16A to 16C are a top view and cross-sectional views illustrating a structure example of an OS transistor;

FIGS. 17A to 17C are a top view and cross-sectional views illustrating a structure example of an OS transistor;

FIGS. 18A to 18C are a top view and cross-sectional views illustrating a structure example of an OS transistor;

FIGS. 19A to 19C are a top view and cross-sectional views illustrating a structure example of an OS transistor;

FIGS. 20A to 20C are a top view and cross-sectional views illustrating a structure example of an OS transistor;

FIGS. 21A to 21C are a top view and cross-sectional views illustrating a structure example of an OS transistor;

BEST MODE FOR CARRYING OUT THE INVENTION

Figure 1:
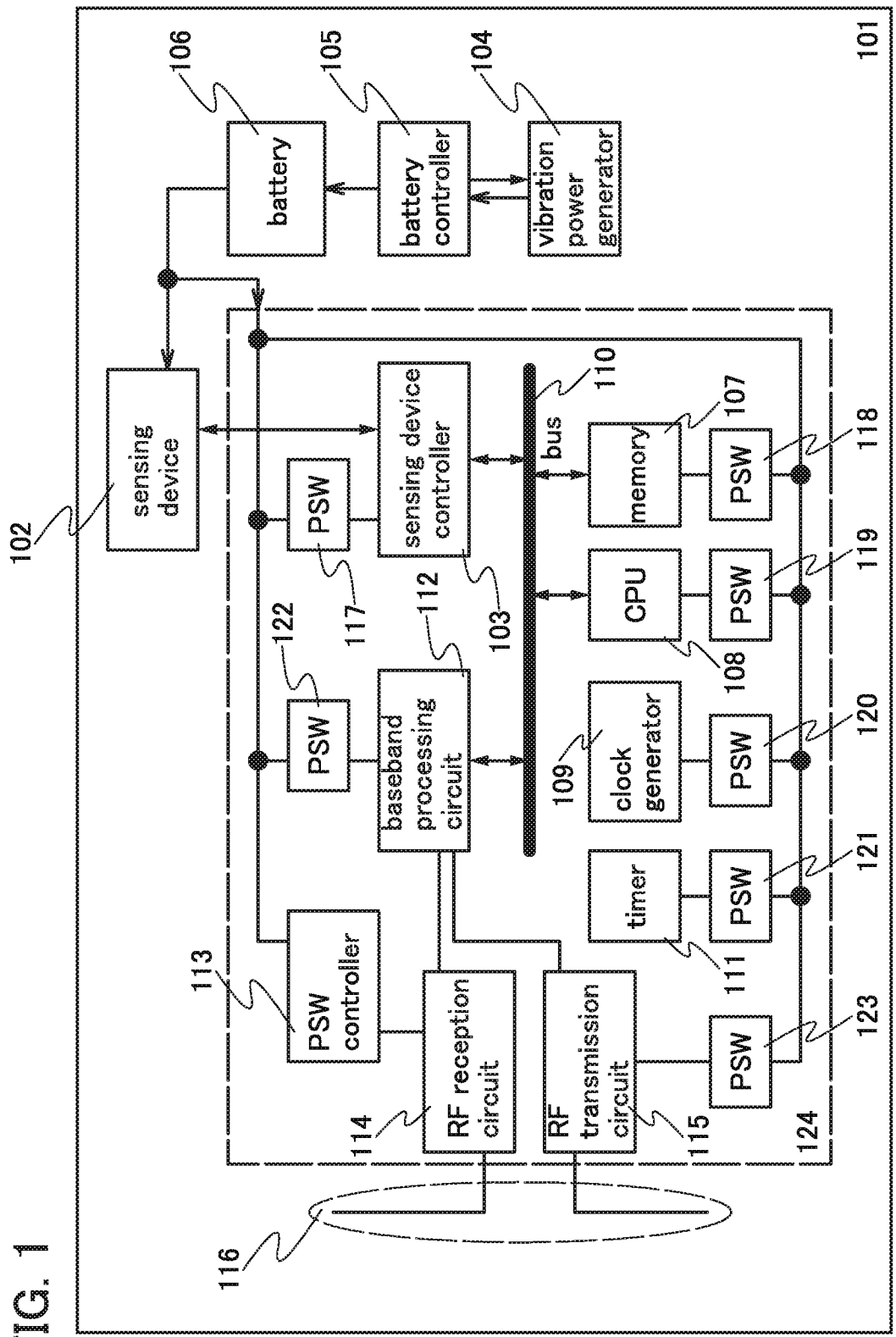
FIG. 1 is a block diagram illustrating a structure example of a sensor system.

Embodiments will be described below with reference to drawings. However, the embodiments can be implemented with various modes. It will be readily appreciated by those skilled in the art that modes and details can be changed in various ways without departing from the spirit and scope of the present invention. The present invention therefore should not be construed as being limited to the following description of the embodiments.

Note that in this specification, a sensor system that is one embodiment of the present invention is a semiconductor device that includes a device for sensing physical quantity or chemical quantity in addition to a vibration power generator, a battery, a memory, a CPU, a timer, an RF reception circuit, an RF transmission circuit, and a power switch (PSW). Thus, a sensor system means a semiconductor device that is one embodiment of the present invention. Therefore, the sensor system is also referred to as a semiconductor device, an electronic device, or the like in some cases.

In the drawings, the size, the layer thickness, the region, or the like is exaggerated for clarity in some cases. Thus, embodiments of the present invention are not limited to such scales. The drawings are schematic views showing ideal examples, and embodiments of the present invention are not limited to shapes or values shown in the drawings.

In this specification, the terms "film" and "layer" can be interchanged with each other. For example, the term "conductive layer" can be changed into the term "conductive film" in some cases. Moreover, the term "insulating film" can be changed into the term "insulating layer" in some cases.

In this specification, terms for describing arrangement, such as "over," "above," "under," and "below" are used for convenience for describing the positional relationship between components with reference to drawings. Furthermore, the positional relationship between components is changed as appropriate in accordance with a direction in which each component is described. Thus, there is no limitation on terms used in this specification, and description can be made appropriately depending on the situation.

In this specification, the term "electrically connected" includes the case where components are connected through an object having any electric function. There is no particular limitation on the "object having any electric function" as long as electric signals can be transmitted and received between components that are connected through the object. Examples of the "object having any electric function" include a switching element such as a transistor, a resistor, an inductor, a capacitor, and an element with a variety of functions as well as an electrode and a wiring.

In this specification, the term "parallel" indicates that an angle formed between two straight lines is greater than or equal to −10° and less than or equal to 10°, and accordingly also includes the case where an angle is greater than or equal to −5° and less than or equal to 5°. The term "perpendicular" indicates that an angle formed between two straight lines is greater than or equal to 80° and less than or equal to 100°, and accordingly also includes the case where an angle is greater than or equal to 85° and less than or equal to 95°.

In this specification, ordinal numbers such as "first", "second", and "third" are used in order to avoid confusion among components, and do not limit the number of components.

In this specification, a transistor is an element having at least three terminals of a gate, a drain, and a source. The transistor has a channel region between a drain (a drain terminal, a drain region, or a drain electrode) and a source (a source terminal, a source region, or a source electrode), and current can flow through the drain, the channel region, and the source. Note that in this specification, a channel region refers to a region through which current mainly flows.

Furthermore, the functions of a source and a drain might be switched when transistors having different polarities are employed or a direction of current flow is changed in circuit operation, for example. Therefore, the terms "source" and "drain" can be interchanged in this specification.

Unless otherwise specified, off-state current in this specification refers to drain current of a transistor in an off state (also referred to as a non-conduction state or a cutoff state). Unless otherwise specified, the off state of an n-channel transistor means that a potential difference between its gate and source (Vgs: gate-source voltage) is lower than the threshold voltage Vth, and the off state of a p-channel transistor means that the gate-source voltage Vgs is higher than the threshold voltage Vth. For example, the off-state current of an n-channel transistor sometimes refers to drain current that flows when the gate-source voltage Vgs is lower than the threshold voltage Vth.

In the above description of off-state current, a drain may be replaced with a source. That is, the off-state current sometimes refers to current that flows through a source when a transistor is off.

In this specification, the term "leakage current" sometimes expresses the same meaning as off-state current. In addition, in this specification, the off-state current sometimes refers to current that flows between a source and a drain when a transistor is off, for example.

In this specification, an oxide semiconductor is referred to as an OS in some cases. Thus, a transistor including an oxide semiconductor in a channel formation region is referred to as an oxide semiconductor transistor, an OS transistor, or an OSFET in some cases.

Embodiment 1

In this embodiment, a sensor system is described.

Structure Example 1

FIG. 1 illustrates an example of a sensor system. A sensor system 101 includes a sensing device 102, a vibration power generator 104, a battery controller 105, a battery 106, a signal processing portion 124, and an antenna 116. The battery controller 105 rectifies the output of the vibration power generator 104 and adjusts the voltage of the vibration power generator 104 to supply the rectified output and the adjusted voltage to the sensor system 101 and charge the battery 106. The battery controller 105 has a function of suppressing power generation to prevent overcharge when the amount of power generation is too large.

The sensor system 101 is capable of supplying power from the battery 106 even when power generation in the vibration power generator 104 is stopped. Note that the vibration power generator 104 is not limited to a vibration power generator. An energy harvesting device such as a solar power generator or a power generator by temperature difference can be used depending on circumstances. In addition, an energy harvesting device can be combined with a vibration power generator.

The signal processing portion 124 includes a sensing device controller 103, a memory 107, a CPU 108, a clock generator 109, a bus 110, a timer 111, a baseband processing circuit 112, a power switch (PSW) controller 113, an RF reception circuit 114, an RF transmission circuit 115, a PSW 117, a PSW 118, a PSW 119, a PSW 120, a PSW 121, a PSW 122, and a PSW 123.

The signal processing portion 124 can be provided in one IC chip.

The sensing device 102 has a function of measuring at least one of pieces of environmental information such as temperature, humidity, atmospheric pressure, a light wavelength, light quantity, acceleration, and a gas concentration. The sensing device controller 103 includes an analog-digital converter circuit and is capable of converting sensing data into digital data and supplying the digital data to the bus 110.

The sensor system 101 has a function of obtaining sensing data at timing controlled by the timer 111. The memory 107 is a nonvolatile memory that has a function of storing pieces of sensing data.

The baseband processing circuit 112, the RF reception circuit 114, the RF transmission circuit 115, and the antenna 116 construct a wireless device (or a wireless communication portion). The wireless device has a function of transmitting data of the bus 110 and a function of receiving a signal from the outside. The RF reception circuit 114 may be either a passive type of not being supplied with power from the battery 106 or an active type of being connected to the battery 106.

The baseband processing circuit 112 has a function of converting data of the bus 110 into a signal suitable for communication and a function of converting a signal used for communication into the data of the bus 110. The baseband processing circuit 112 can be omitted in some cases, for example, the case where the CPU 108 can have such a function.

The RF transmission circuit 115 has a function of modulating a signal that has been subjected to baseband processing into a signal in a frequency band used for wireless communication. The RF reception circuit 114 has a function of demodulating the signal in the frequency band used for wireless communication. The antenna 116 has a function of converting an electric signal into an electromagnetic wave and has a function of converting an electromagnetic wave into an electric signal.

The PSW controller 113 has an ID determination function, a function of analyzing whether IDs received in the RF reception circuit 114 coincide, and a function of individually operating the PSW 117, the PSW 118, the PSW 119, the PSW 120, the PSW 121, the PSW 122, and the PSW 123.

The PSW 117, the PSW 118, the PSW 119, the PSW 120, the PSW 121, the PSW 122, and the PSW 123 have functions of stopping supply of power to the sensing device controller 103, the memory 107, the CPU 108, the clock generator 109, the timer 111, the baseband processing circuit 112, and the RF transmission circuit 115 to which the PSW 117, the PSW 118, the PSW 119, the PSW 120, the PSW 121, the PSW 122, and the PSW 123 are connected, respectively.

A power storage device such as a capacitor or a secondary battery, or the like can be used as the battery 106. As the secondary battery, a lead-acid battery, a nickel-cadmium battery, a nickel-hydride battery, or a lithium-ion battery can be used, for example. As the capacitor, an electric double layer capacitor, or a hybrid capacitor in which one of a pair of electrodes has an electric double layer structure and the other of the pair of electrodes utilizes oxidation-reduction reaction can be used, for example. The hybrid capacitor, for example, includes a lithium ion capacitor in which a positive electrode has an electric double layer structure and a negative electrode has a lithium ion secondary battery structure.

Operation Example 1

Figure 2:
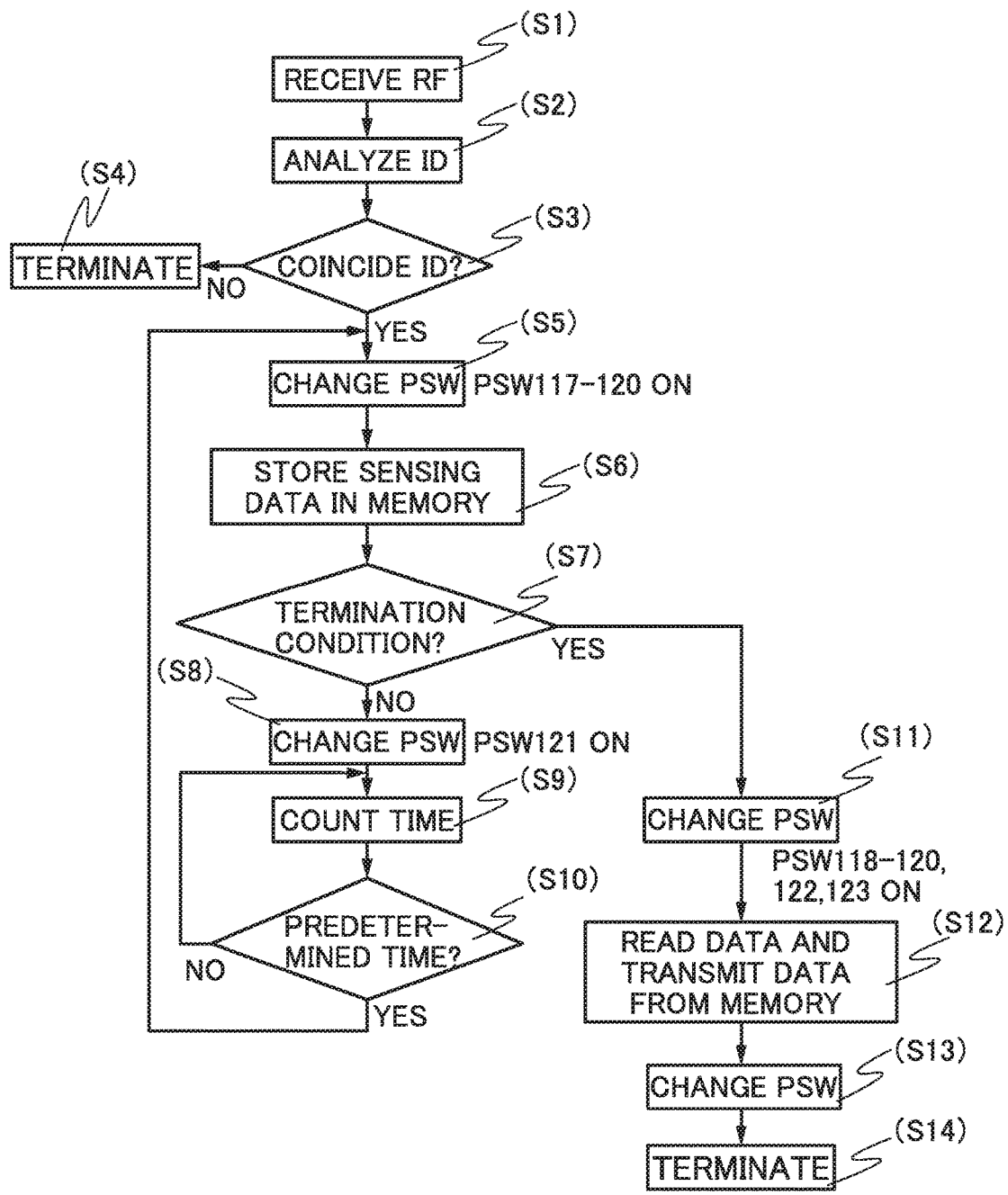
FIG. 2 is a flow chart showing an operation example of the sensor system.

Next, an operation example of the sensor system 101 is described with reference to FIG. 2. FIG. 2 is a flow chart showing an operation example of the sensor system 101.

After the RF reception circuit 114 receives a signal from the outside (step S1), the PSW controller 113 analyzes whether the signal from the outside coincides with ID registered in advance (steps S2 and S3). When the signal coincides with the ID, the PSW controller 113 operates the PSW 117, the PSW 118, the PSW 119, and the PSW 120 to supply power to the sensing device controller 103, the memory 107, the CPU 108, and the clock generator 109 (step S5). When the signal does not coincide with the ID, the operation of the sensor system 101 is terminated because power is not supplied to the sensing device controller 103, the memory 107, the CPU 108, and the clock generator 109 (step S4).

The sensing device controller 103 controls the sensing device 102 so that the sensing device 102 performs sensing. The sensing device 102 obtains the physical quantity or chemical quantity of the external environment as sensing data and outputs the sensing data to the sensing device controller 103. The sensing device controller 103 converts the sensing data into digital data. The CPU 108 stores the digital data converted by the sensing device controller 103 in the memory 107 through the bus 110 (step S6).

Next, the CPU 108 determines whether to continue measurement based on a termination condition (step S7). Examples of the termination condition include the number of measurement times that reaches a predetermined number of measurement times and reception of a signal for stopping measurement from the outside. At least one condition is used as the termination condition. When the termination condition is not satisfied, the PSW controller 113 operates the PSW 117, the PSW 118, the PSW 119, the PSW 120, and the PSW 121 to stop supply of power to the sensing device controller 103, the memory 107, the CPU 108, and the clock generator 109 and to supply power to the timer 111 (step S8). In this state, the timer 111 counts time that elapses before the next sensing (steps S9 and S10).

The timer 111 counts the time and transmits a signal for count termination to the PSW controller 113 when the next sensing timing comes (step S10). The PSW controller 113 operates the PSW 117, the PSW 118, the PSW 119, and the PSW 120 to supply power to the sensing device controller 103, the memory 107, the CPU 108, and the clock generator 109 and operates the PSW 121 to stop supply of power to the timer 111 (step S5).

The sensing device controller 103 controls the sensing device 102. When the sensing device 102 obtains the physical quantity or chemical quantity of the external environment as sensing data, the sensing device controller 103 converts the sensing data into digital data. The CPU 108 stores the digital data converted by the sensing device controller 103 in the memory 107 through the bus 110 (step S6).

In this manner, the CPU 108 stores the sensing data in the memory 107 a specified number of times or stores the sensing data in the memory 107 more than once until the RF reception circuit 114 receives a stop signal from the outside. In the sensor system 101, when the measurement (step S6) is not performed, supply of power to the sensing device controller 103, the memory 107, the CPU 108, and the clock generator 109 is stopped; thus, power consumption of the sensor system 101 can be reduced. Similarly, supply of power to the sensing device 102 may be stopped when the measurement is not performed.

When the memory 107 stores the sensing data a specified number of times or the RF reception circuit 114 receives a stop signal from the outside, the PSW controller 113 operates the PSW 117, the PSW 118, the PSW 119, the PSW 120, the PSW 122, and the PSW 123 to supply power to the memory 107, the CPU 108, the clock generator 109, the baseband processing circuit 112, and the RF transmission circuit 115 and to stop supply of power to the sensing device controller 103 (step S11).

The CPU 108 transmits the sensing data stored in the memory 107 to the outside through the baseband processing circuit 112, the RF transmission circuit 115, and the antenna 116 (step S12). The PSW controller 113 turns off the PSW 118, the PSW 119, the PSW 120, the PSW 122, and the PSW 123 (step S13) to terminate a series of operations (step S14).

Usage example of the sensor system are described below.

Usage Example 1

An example in which the sensor system is applied to a refrigerated transport service suitable for food shipment is described as a usage example. In general, a refrigeration-type refrigerated transport service and a freezing-type refrigerated transport service are used as refrigerated transport services. A package is exposed to outside air at the timing of transshipment of the package to a refrigerator car or timing of sorting, for example. Thus, the package is not always kept cool. Although a business operator of the service explains to a user that a temporal increase in package temperature occurs for such reasons, the gap between expected temperature of outside air or exposure time and the actual temperature of outside air or exposure time has been a problem.

In general, in a home delivery business, a package is picked up by a branch office of a business operator, a convenience store, a pickup and delivery vehicle, or the like and is delivered to a distribution center in an area from the business operator, the convenience store, the pickup and delivery vehicle, or the like. In the distribution center, the baggage is sorted and transshipped to a lorry for each destination and is delivered to a distribution center in a destination area. The baggage is further sorted and transshipped and is delivered to a branch office in each destination. Then, the package is delivered to destinations such as housing.

Figure 3:
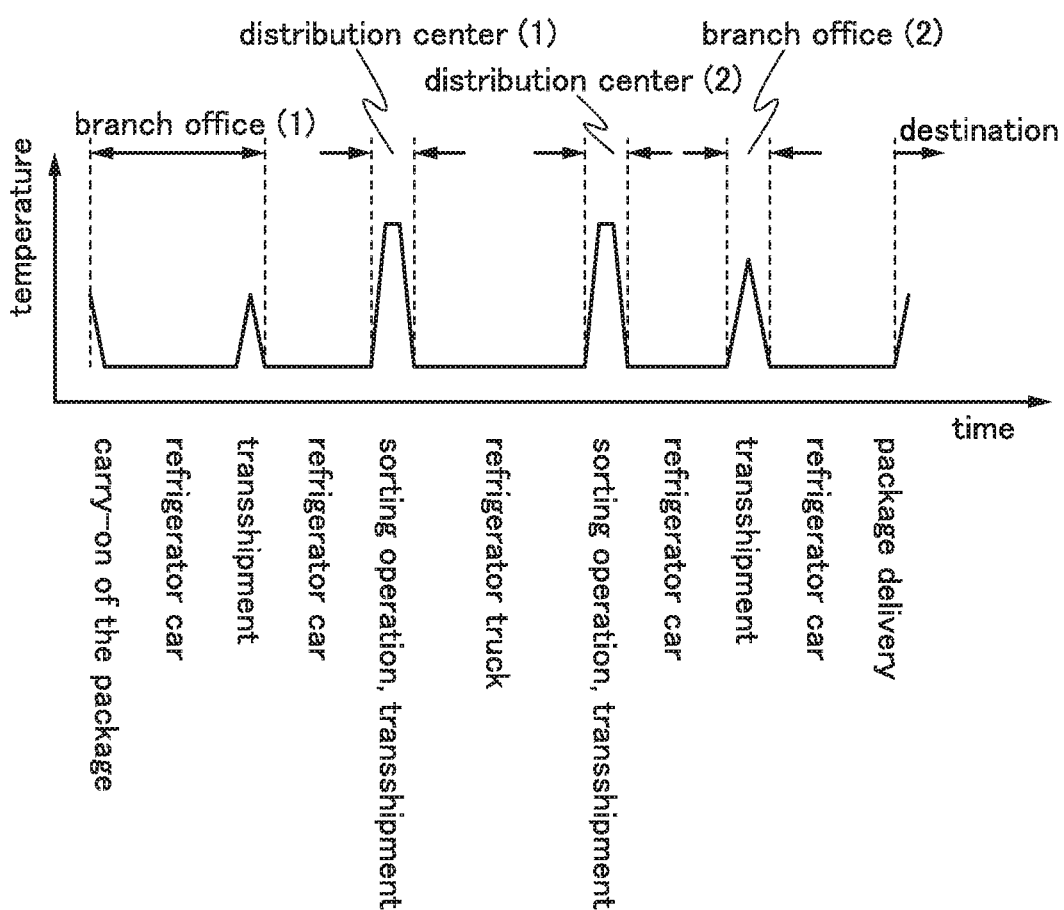
FIG. 3 shows an example of a change in package temperature.

FIG. 3 illustrates an example in which the vertical axis represents environmental temperature of a package from carry-on of the package to a branch office (1) of a business operator to delivery to a destination and the horizontal axis represents time. In this example, a refrigerated transport service is to be used, and a refrigerator car and a refrigerator truck are to be used instead of the pickup and delivery vehicle and the lorry. It is needless to say that a transportation means is not limited to a truck. A craft, an airplane, a train, or the like might be used depending on a transportation distance, a destination, and the like.

At the time of carry-on of the package to the branch office (1) or transshipment of the package to the refrigerator car, the package might be exposed to outside air. Moreover, the package might be exposed to outside air for a comparatively long time because sorting operation and the like are needed in the distribution center (1) in a departure area and a distribution center (2) in a destination area. After that, final transshipment is terminated in a branch office (2) in the destination area, and then, the package is delivered to each destination such as housing.

Figure 4A:
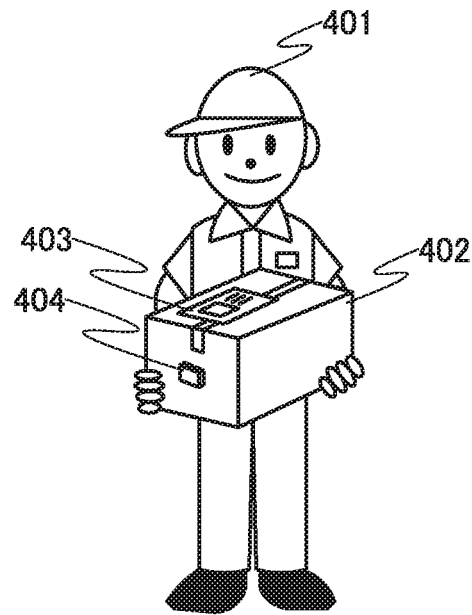
FIGS. 4A and 4B illustrate usage examples of a sensor system.
Figure 4B:
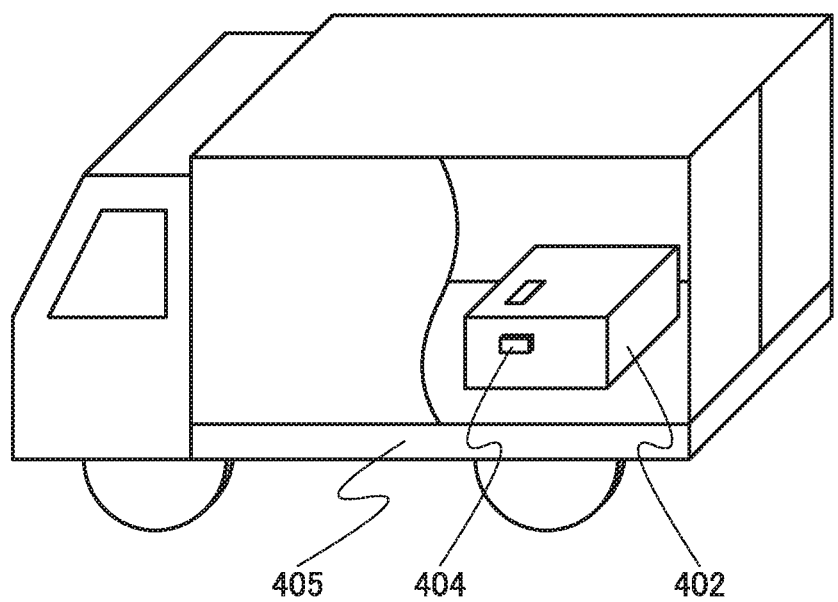

Although the user understands that package is temporarily exposed to outside air in this manner, time during which the package is exposed to outside air or the temperature of outside air might pose a problem. Thus, the sensor system described in the structure example 1 is used in order to measure the time during which the package is exposed to outside air or the temperature of outside air. FIGS. 4A and 4B illustrate an example in which the sensor system is attached to the package.

As illustrated in FIG. 4A, a slip 403 and a sensor system 404 are attached to a package 402. When the package is checked, the sensor system 404 may be attached to the package 402 like the slip 403. The sensor system 101 is used as the sensor system 404. While an operator 401 treats the package 402, the temperature is measured by the sensor system 404. After a wireless signal for measurement start is transmitted to the sensor system 404 from the outside and the package 402 is delivered to a destination, a wireless signal for measurement end may be transmitted to read data.

For example, data read from the sensor system 404 is stored in a data center of a business office. The stored data is downloaded through the Internet by using a slip number described in the slip 403. Alternatively, the user can directly read data from the sensor system 404 by using a smartphone or the like. A graph of the obtained data indicates a temperature history similar to that in FIG. 3. For example, a business operator provides an application data for visualization (e.g., a graph or a table). When the user installs this application in a computer terminal (e.g., a smartphone, a tablet terminal, or a personal computer), the user can check the temperature history of the package 402 on the computer terminal.

As illustrated in FIG. 4B, in a refrigerated transport service, the package 402 is delivered by a refrigerator car 405. While the refrigerator car 405 is moving, a vibration power generator of the sensor system 404 generates power by vibration, and power is supplied to devices of the sensor system 404 and a battery is charged.

Since the sensor system 404 includes a power generation mechanism and a power storage mechanism, a wiring for power supply is not needed and thus there is no limitation on an installation location. If the sensor system 404 is retrieved at the time of delivery of the package 402, the sensor system 404 can be reused as it is. Even while vibration of the refrigerator car 405 is stopped for a traffic light or the like, power can be supplied from an internal battery; thus, the sensor system 404 can continue to obtain data at predetermined intervals. The data obtained in this manner is of importance in light of security of the package such as food and credibility of a home-delivery business operator.

Usage Example 2

Figure 5:
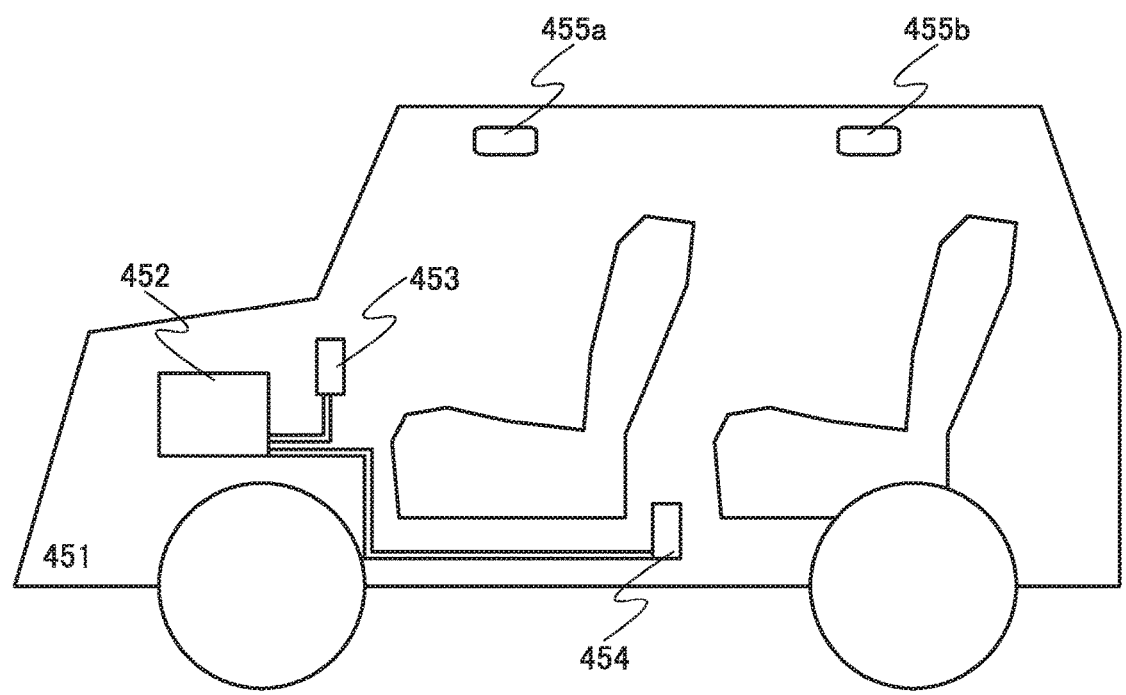
FIG. 5 illustrates a usage example of a sensor system.

FIG. 5 is an example in which a sensor system is used as an environmental sensor in a motor vehicle. An air conditioner 452 and vents 453 and 454 are provided in a motor vehicle 451. Sensor systems 455a and 455b are provided on a ceiling to measure environmental information such as temperature, humidity, and light quantity regularly and transmit data to the air conditioner 452 wirelessly. The sensor system 101 is used as each of the sensor systems 455a and 455b.

Figure 6:
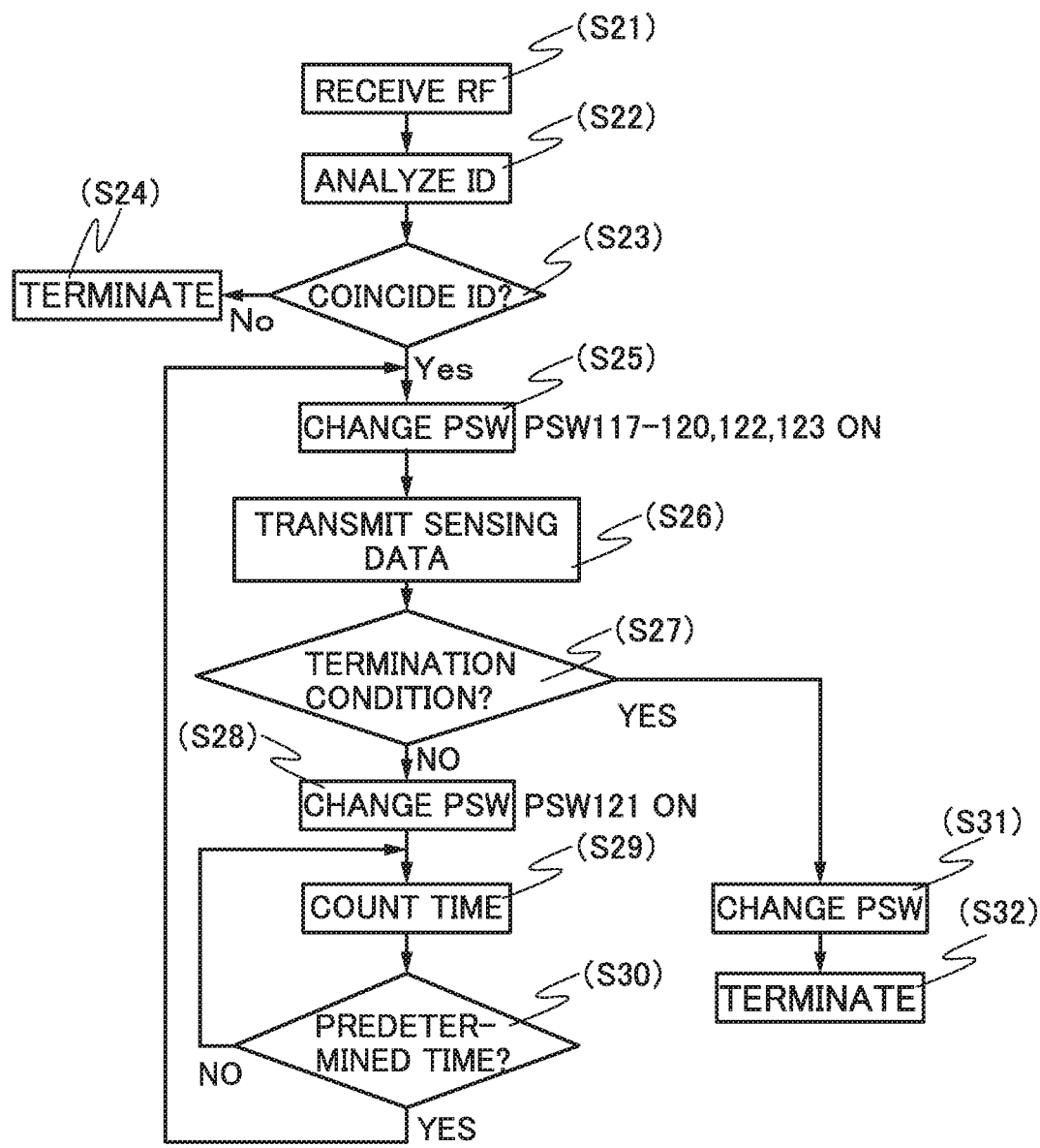
FIG. 6 is a flow chart showing an operation example of the sensor system.

FIG. 6 is a flow chart showing an operation example of the sensor systems 455a and 455b. Steps S21 to S24 are similar to steps S1 to S4 in FIG. 2. Here, when data is transmitted to the air conditioner 452, it is not necessary to store the data. Thus, in step S25, the PSW controller 113 operates the PSW 117, the PSW 118, the PSW 119, the PSW 120, the PSW 122, and the PSW 123 to supply power to the sensing device controller 103, the memory 107, the CPU 108, the clock generator 109, the baseband processing circuit 112, and the RF transmission circuit 115.

The sensing device controller 103 controls the sensing device 102. When the sensing device 102 obtains the physical quantity or chemical quantity of the external environment as sensing data, the sensing device controller 103 converts the sensing data into digital data. The CPU 108 transfers the digital data converted by the sensing device controller 103 to the baseband processing circuit 112 through the bus 110. The data is transmitted to the outside through the RF transmission circuit 115 and the antenna 116 (step S26).

Next, the CPU 108 determines whether to continue measurement (step S27). Examples of the termination condition for step 27 include reception of a signal for stopping measurement from the outside. When the termination condition is not satisfied, the PSW controller 113 operates the PSW 117, the PSW 118, the PSW 119, the PSW 120, the PSW 121, the PSW 122, and the PSW 123 to stop supply of power to the sensing device controller 103, the memory 107, the CPU 108, the clock generator 109, the baseband processing circuit 112, and the RF transmission circuit 115 and to supply power to the timer 111 (step S28). In this state, the timer 111 counts time that elapses before the next sensing (steps S29 and S30).

The timer 111 counts the time and transmits a signal for count termination to the PSW controller 113 when the next sensing timing comes (step S30). The PSW controller 113 operates the PSW 117, the PSW 118, the PSW 119, the PSW 120, the PSW 121, the PSW 122, and the PSW 123 to supply power to the sensing device controller 103, the memory 107, the CPU 108, the clock generator 109, the baseband processing circuit 112, and the RF transmission circuit 115 to stop supply of power to the timer 111 (step S25).

The sensing device controller 103 controls the sensing device 102. When the sensing device 102 obtains the physical quantity or chemical quantity of the external environment as sensing data, the sensing device controller 103 converts the sensing data into digital data. The CPU 108 transfers the digital data converted by the sensing device controller 103 to the baseband processing circuit 112 through the bus 110. The data is transmitted to the outside through the RF transmission circuit 115 and the antenna 116 (step S26).

In this manner, the CPU 108 transmits the sensing data to the outside more than once until the RF reception circuit 114 receives a stop signal from the outside. In the sensor system 101, when the measurement (step S26) is not performed, supply of power to the sensing device controller 103, the memory 107, the CPU 108, the clock generator 109, the baseband processing circuit 112, and the RF transmission circuit 115 is stopped; thus, power consumption of the sensor systems 455a and 455b can be reduced. Similarly, supply of power to the sensing device 102 may be stopped when the measurement is not performed.

When the RF reception circuit 114 receives a stop signal from the outside, the PSW controller 113 turns off the PSW 117, the PSW 118, the PSW 119, the PSW 120, the PSW 122, and the PSW 123 (step S31) to terminate a series of operations (step S32).

Since the sensor systems 455a and 455b each include the vibration power generator 104, while the motor vehicle 451 is moving, power is generated by vibration, so that power can be supplied to devices of the sensor systems and a battery can be charged. Even while vibration of the motor vehicle 451 is stopped for a traffic light or the like, power can be supplied from an internal battery; thus, the sensor systems 455a and 455b can continue to measure and transmit data at predetermined intervals.

For example, if measurement is performed once every second and the time required for data measurement and transmission is 0.1 seconds, the CPU 108 and the RF transmission circuit 115 can be turned off for the remaining time of 0.9 seconds; thus, power consumption of the sensor systems 455a and 455b can be reduced. It is not necessary to route a wiring required for power supply from the battery of the motor vehicle; thus, the number of locations where the sensor systems can be provided can be increased, that is, the sensor system can be easily provided underfoot or a luggage space. When the sensor systems can be provided in a plurality of places, environment can be controlled with high accuracy and a comfortable space can be obtained with a simple structure.

Structure Example 2

Figure 7:
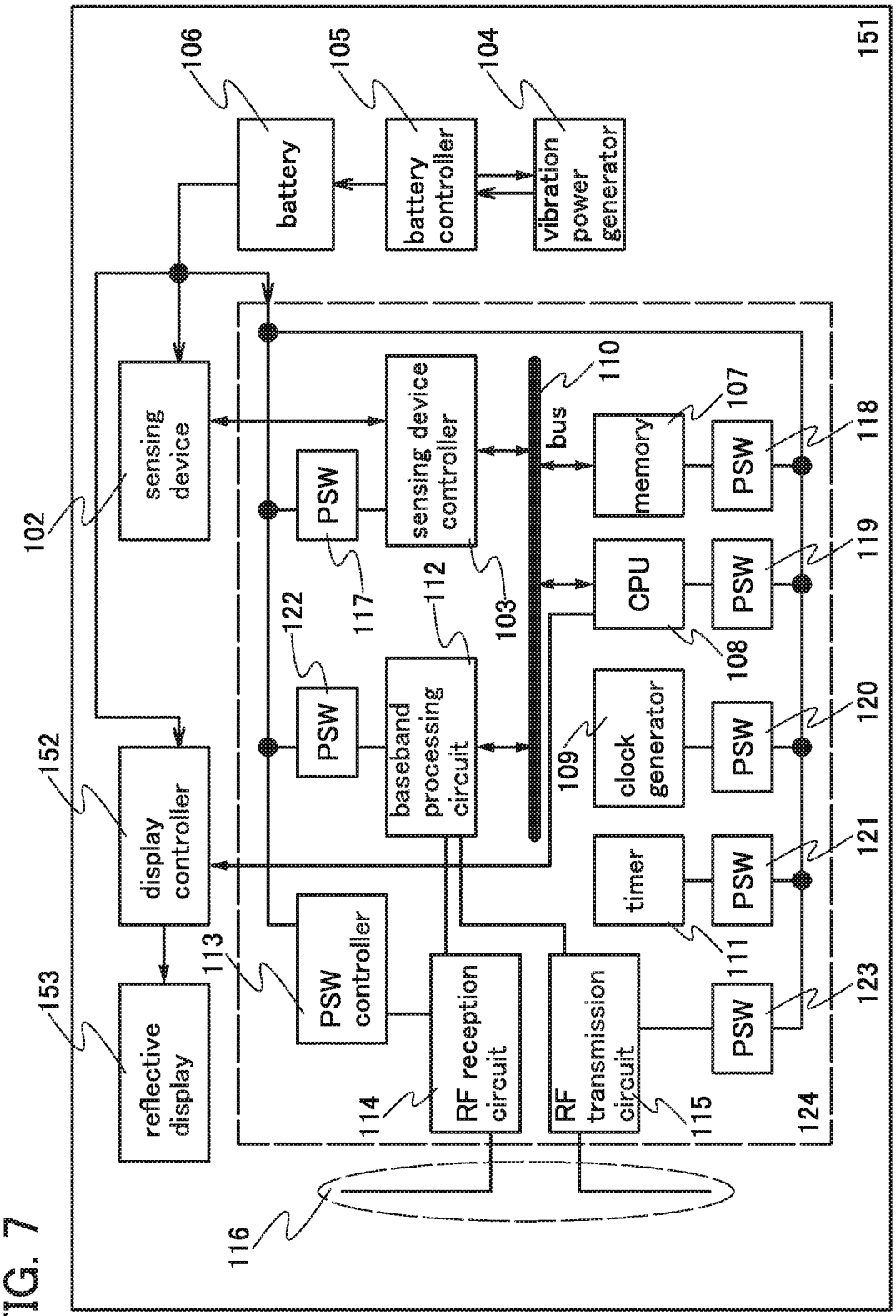
FIG. 7 is a block diagram illustrating a structure example of a sensor system.

A display device may be added to a sensor system. A sensor system 151 in FIG. 7 is obtained by adding a display controller 152 and a reflective display 153 to the sensor system 101.

The CPU 108 included in the sensor system 151 has a function of transmitting a signal or the like that notifies a current measurement value and the fact that a value exceeds a predetermined value. The display controller 152 has a function of transmitting a signal required to drive the reflective display 153, power, and image data to the reflective display 153.

For example, the sensor system 151 can display a current measurement value and an alarm that notifies the fact that a value exceeds a predetermined value. A reflective liquid crystal display, electronic paper, or the like can be used as the reflective display 153. Since the reflective display 153 does not require a light source, power consumption of the sensor system 151 can be reduced.

It is preferable to use an oxide semiconductor transistor as a pixel switching transistor of the reflective display 153. In this specification, a transistor whose channel formation region includes an oxide semiconductor is referred to as an oxide semiconductor transistor or an OS transistor.

The oxide semiconductor transistor has extremely low leakage current. Thus, when the oxide semiconductor transistor is used as a pixel switching transistor, image data can be retained for a long time and the frequency of refresh operations can be reduced. Consequently, power consumption required for the refresh operations can be reduced.

Embodiment 2

In this embodiment, a memory is described. The memory in this embodiment can be used as a memory of the above sensor system.

Figure 8:
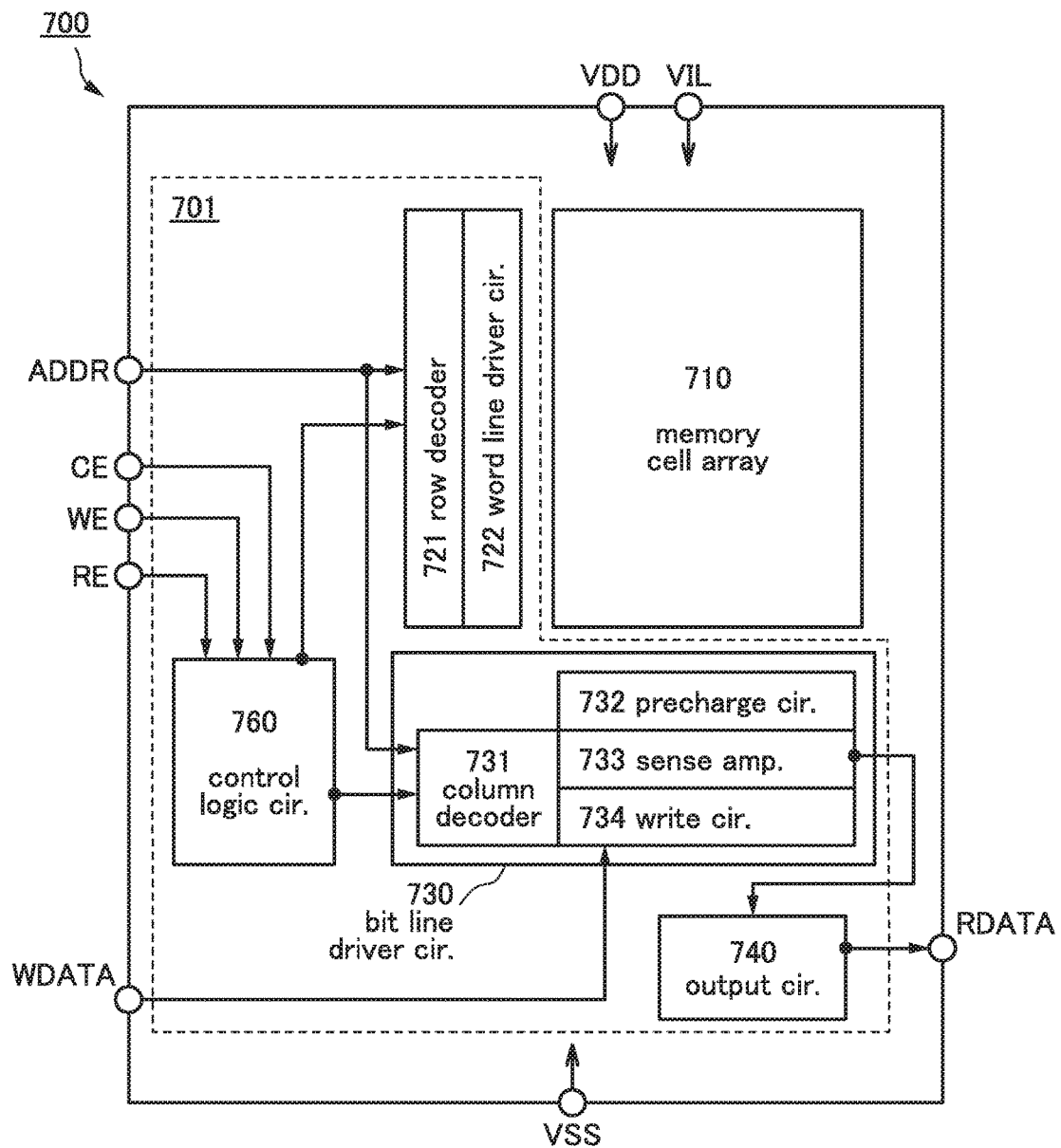
FIG. 8 is a block diagram illustrating a structure example of a memory.

FIG. 8 illustrates a structure example of a memory. A memory 700 includes a peripheral circuit 701 and a memory cell array 710.

The memory cell array 710 includes a plurality of memory cells, a plurality of bit lines, and a plurality of word lines. The memory cell will be described in Embodiment 3.

The peripheral circuit 701 includes a row decoder 721, a word line driver circuit 722, a bit line driver circuit 730, an output circuit 740, and a control logic circuit 760.

The bit line driver circuit 730 includes a column decoder 731, a precharge circuit 732, a sense amplifier 733, and a write circuit 734. The precharge circuit 732 has a function of precharging a bit line. The sense amplifier 733 has a function of amplifying a data signal read from the bit line. The amplified data signal is output as a digital data signal RDATA from the memory 700 through the output circuit 740.

As power supply voltages, low power supply voltage (VSS), high power supply voltage (VDD) for the peripheral circuit 701, and high power supply voltage (VIL) for the memory cell array 710 are supplied to the memory 700 from the outside.

Control signals (CE, WE, and RE), an address signal ADDR, and a data signal WDATA are input to the memory 700 from the outside. ADDR is input to the row decoder 721 and the column decoder 731, and WDATA is input to the write circuit 734.

The control logic circuit 760 processes the signals (CE, WE, and RE) input from the outside, and generates control signals for the row decoder 721 and the column decoder 731. CE, WE, and RE are a chip enable signal, a write enable signal, and a read enable signal, respectively. Signals processed by the control logic circuit 760 are not limited to those listed above, and other control signals may be input as necessary.

Note that the decision whether the circuits and signals described above are used or not can be made as appropriate as necessary.

When a p-channel Si transistor and a transistor whose channel formation region includes an oxide semiconductor (preferably an oxide containing In, Ga, and Zn) described in a later embodiment are used in the memory 700, the memory 700 can be reduced in size. In addition, the memory 700 can be reduced in power consumption. Furthermore, the memory 700 can be increased in operation speed. In particular, by using only a p-channel transistor as the Si-transistor, manufacturing cost can be reduced.

Note that this embodiment can be combined with any of the other embodiments in this specification as appropriate.

Embodiment 3

In this embodiment, a memory cell is described. FIGS. 9A to 9E and FIGS. 10A and 10B are circuit diagrams each illustrating a structure example of a memory cell.

Figure 9A:
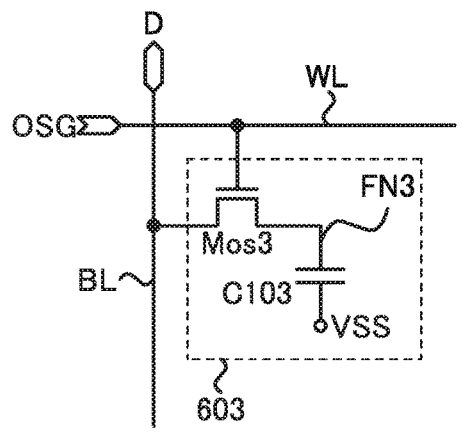
FIGS. 9A to 9E are circuit diagrams each illustrating a structure example of a memory cell.

A memory cell 603 in FIG. 9A includes a transistor Mos3 and a capacitor C103. One of a source and a drain of the transistor Mos3 is electrically connected to a wiring BL. The other of the source and the drain of the transistor Mos3 is electrically connected to one electrode of the capacitor C103. A gate of the transistor Mos3 is electrically connected to a wiring WL. The low power supply voltage (VSS) is applied to the other electrode of the capacitor C103.

A node FN3 is provided between the other of the source and the drain of the transistor Mos3 and the one electrode the capacitor C103 and serves as a data retention portion. The transistor Mos3 functions as a switch that connects the node FN3 to the wiring BL. A signal D is input and output to and from the wiring BL as a write signal and a read signal. As a signal for selecting a memory cell, a signal OSG is input to the wiring WL.

Data writing and data reading are performed when the transistor Mos3 is turned on to connect the node FN3 to the wiring BL. The wiring BL and a wiring BLB are bit lines.

Figure 10A:
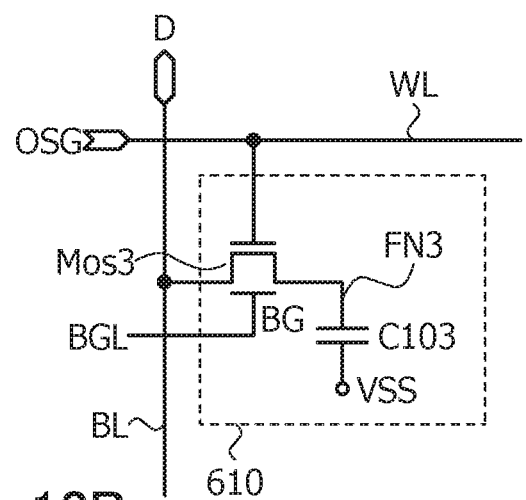
FIGS. 10A and 10B are circuit diagrams each illustrating a structure example of a memory cell.
Figure 10B:
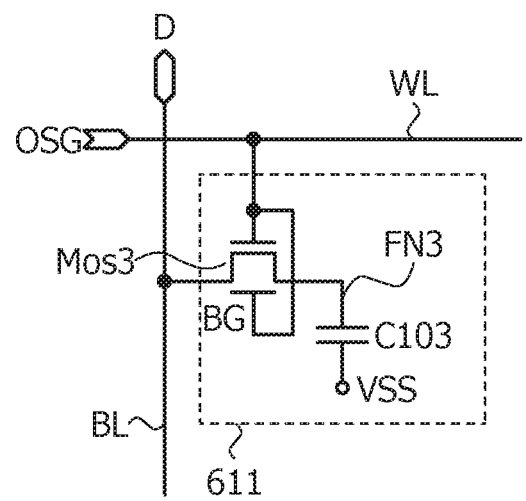

FIGS. 10A and 10B illustrate a memory cell 610 and a memory cell 611 in each of which a back gate is added to the memory cell 603. In the memory cell 610, a back gate BG and a wiring BGL are provided for the transistor Mos3, and a low potential is applied to the back gate BG from the wiring BGL. The threshold voltage of the transistor Mos3 can be controlled by controlling the potential from the wiring BGL. In the memory cell 611, the back gate BG is provided for the transistor Mos3 and electrically connected to the front gate of the transistor Mos3 (or the wiring WL). With this structure, the same potential is applied to the front gate and the back gate BG, so that the amount of current flowing through the transistor Mos3 when the transistor Mos3 is on can be increased.

Note that the back gate can be provided not only in the memory cells 610 and 611 but also in other memory cells. For example, the back gate can be provided in a memory cell 604, a memory cell 605, a memory cell 606, and a memory cell 600 described later in this embodiment.

Figure 9B:
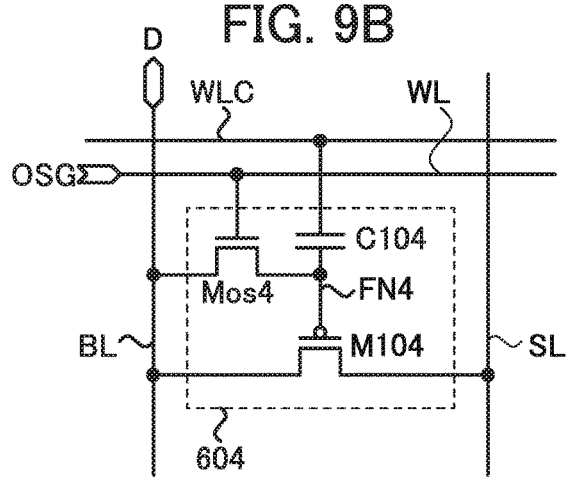

The memory cell 604 in FIG. 9B includes a transistor Mos4, a transistor M104, and a capacitor C104. One of a source and a drain of the transistor Mos4 is electrically connected to the wiring BL. The other of the source and the drain of the transistor Mos4 is electrically connected to one electrode of the capacitor C104 and a gate of the transistor M104. A gate of the transistor Mos4 is electrically connected to the wiring WL. One of a source and a drain of the transistor M104 is electrically connected to the wiring BL. The other of the source and the drain of the transistor M104 is electrically connected to a wiring SL. The other electrode of the capacitor C104 is electrically connected to a wiring WLC.

A node FN4 is provided among the other of the source and the drain of the transistor Mos4, the gate of the transistor M104, and the one electrode the capacitor C104 and serves as a data retention portion. The transistor Mos4 functions as a switch that connects the node FN4 to the wiring BL. The signal OSG is input to the wiring WL. The capacitor C104 connects the wiring WLC to the node FN4. The wiring WLC is a wiring for supplying constant voltage to the electrode of the capacitor C104 in writing and reading operations. The transistor M104 is a p-channel transistor.

While constant voltage is applied to the wirings WLC and SL, data is written by turning on the transistor Mos4 and connecting the node FN4 to the wiring BL. For data reading, constant voltage is applied to the wirings BL, WLC, and SL. The value of current flowing between the source and the drain of the transistor M104 changes depending on the voltage of the node FN4. The wiring BL is charged or discharged by the current between the source and the drain of the transistor M104, so that the value of data retained in the memory cell 604 can be read by detecting the voltage (signal D) of the wiring BL.

Note that the transistor M104 can be an n-channel transistor. In accordance with the conductivity type of the transistor M104, voltage applied to the wirings BL, SL, and WLC is determined.

Figure 9C:
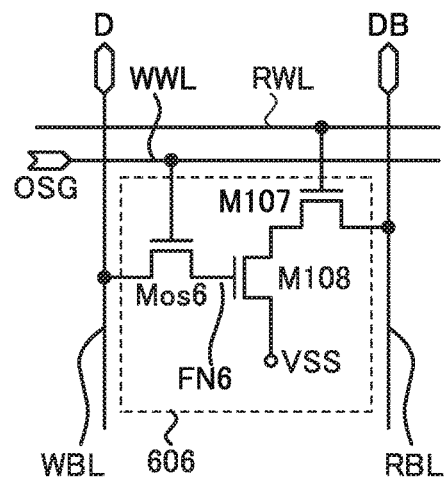

The memory cell 606 in FIG. 9C includes a transistor Mos6, a transistor M107, and a transistor M108. One of a source and a drain of the transistor Mos6 is electrically connected to a wiring WBL. The other of the source and the drain of the transistor Mos6 is electrically connected to a gate of the transistor M108. A gate of the transistor Mos6 is electrically connected to a wiring WWL. One of a source and a drain of the transistor M107 is electrically connected to a wiring RBL. The other of the source and the drain of the transistor M107 is electrically connected to one of a source and a drain of the transistor M108. A gate of the transistor M107 is electrically connected to a wiring RWL. The low power supply voltage (VSS) is applied to the other of the source and the drain of the transistor M108.

A node FN6 is provided between the other of the source and the drain of the transistor Mos6 and the gate of the transistor M108 and serves as a data retention portion. The transistor Mos6 functions as a switch that connects the node FN6 to the wiring WBL. The transistor M107 functions as a switch that connects the wiring RBL to the one of the source and the drain of the transistor M108. The signal D is input to the wiring WBL as a data write signal. As a signal for selecting a memory cell, the signal OSG is input to the wiring WWL.

Data is written by turning on the transistor Mos6 and connecting the node FN6 to the wiring WBL. For data reading, the transistor M107 is turned on after constant voltage is applied to the wiring RBL in advance. The value of current flowing between the source and the drain of the transistor M108 changes depending on the voltage of the node FN6. The wiring RBL is charged or discharged by the current between the source and the drain of the transistor M108, so that the value of data retained in the memory cell 606 can be read by detecting the voltage (signal DB) of the wiring RBL.

Figure 9D:
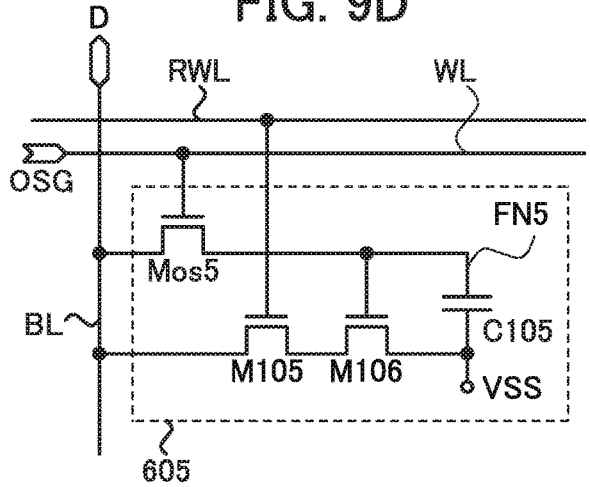

FIG. 9D is a circuit diagram illustrating a structure example of a memory cell. The memory cell 605 includes a transistor Mos5, a transistor M105, a transistor M106, and a capacitor C105. One of a source and a drain of the transistor Mos5 is electrically connected to the wiring BL. The other of the source and the drain of the transistor Mos5 is electrically connected to a gate of the transistor M106 and one electrode of the capacitor C105. A gate of the transistor Mos5 is electrically connected to the wiring WL. One of a source and a drain of the transistor M105 is electrically connected to the wiring BL. The other of the source and the drain of the transistor M105 is electrically connected to one of a source and a drain of the transistor M106. A gate of the transistor M105 is electrically connected to the wiring RWL. The other of the source and the drain of the transistor M106 is electrically connected to the other electrode of the capacitor C105. The low power supply voltage (VSS) is applied to the other of the source and the drain of the transistor M106 and the other electrode of the capacitor C105.

A node FN5 is provided among the other of the source and the drain of the transistor Mos5, the gate of the transistor M106, and the one electrode the capacitor C105 and serves as a data retention portion. The transistor Mos5 functions as a switch that connects the node FN5 to the wiring BL. The signal OSG is input to the wiring WL.

Data is written by turning on the transistor Mos5 and connecting the node FN5 to the wiring BL. Data is read by turning on the transistor M105. The value of current flowing between the source and the drain of the transistor M106 changes depending on the voltage of the node FN5. The wiring BL is charged or discharged by the current between the source and the drain of the transistor M106, so that the value of data retained in the memory cell 605 can be read by detecting the voltage (signal D) of the wiring BL.

Note that the transistors M105 and M106 can be p-channel transistors. In accordance with the conductivity type of the transistors M105 and M106, voltage applied to the wiring RWL and voltage applied to the capacitor C105 may be determined.

Figure 9E:
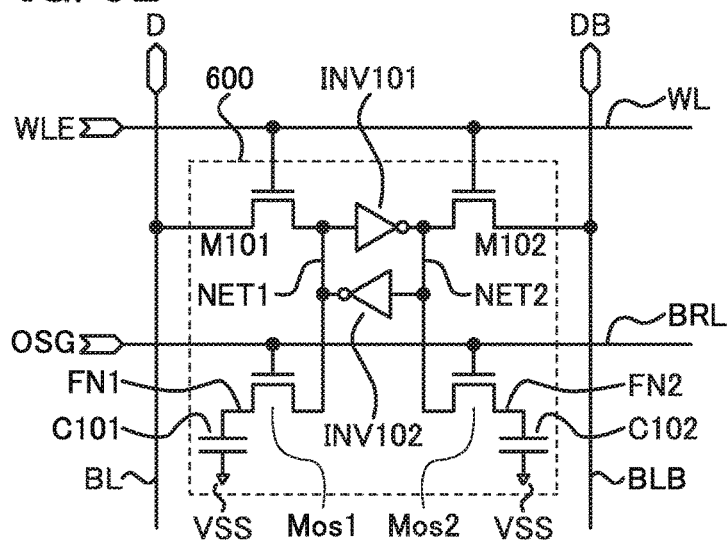

The memory cell 600 in FIG. 9E is an example of an SRAM cell in which backup operation can be performed. The memory cell 600 includes transistors M101, M102, Mos1, and Mos2, inverters INV101 and INV102, and capacitors C101 and C102. The memory cell 600 is connected to the wirings WL, BL, BLB, and BRL. The low power supply voltage (VSS) or the like is applied to the memory cell 600 as power supply voltage.

An input node and an output node of the inverter INV101 are connected with an output node and an input node of the inverter INV102, respectively, so that an inverter loop circuit is formed. Gate electrodes of the transistors M101 and M102 are connected to the wiring WL. The transistor M101 functions as a switch that connects the wiring BL to the input node of the inverter INV101, and the transistor M102 functions as a switch that connects the wiring BLB to the input node of the inverter INV102.

The wiring WL functions as a writing/reading word line, and a signal (WLE) for selecting a memory cell is input from a word line driver circuit. The wirings BL and BLB function as bit lines that transmit data signals D and DB. The data signal DB is a signal that is obtained by inverting the logic value of the data signal D. The data signals D and DB are supplied from a bit line driver circuit. Furthermore, the wirings BL and BLB are also wirings for transmitting data read from the memory cell 600 to an output circuit.

The memory cell 600 corresponds to a circuit including a volatile storage circuit (the inverters INV101 and INV102 and the transistors M101 and M102) and a pair of storage circuits ((the transistor Mos1 and the capacitor C101) and (the transistor Mos2 and the capacitor C102)). The pair of storage circuits (the transistor Mos1 and the capacitor C101) and (the transistor Mos2 and the capacitor C102) are each a circuit for backing up data of the volatile storage circuit by storing potentials held in a node NET1 and a node NET2, respectively. These storage circuits turn on the transistors Mos1 and Mos2 to charge or discharge the capacitors C101 and C102 so that data is written, and turn off the transistors Mos1 and Mos2 to store charge accumulated in the capacitors C101 and C102 so that data is retained without power supply.

Data is recovered by turning on the transistors Mos1 and Mos2. The transistors Mos1 and Mos2 are turned on while supply of power to the inverters INV101 and INV102 is stopped, whereby a node FN1 and the node NET1 are connected so that charge is shared by the node FN1 and the node NET1, and a node FN2 and the node NET2 are connected so that charge is shared by the node FN2 and the node NET2. Then, power is supplied to the inverters INV101 and INV102, so that data is restored to the inverter loop circuit depending on the potentials of the node NET1 and the node NET2. After that, the transistors Mos1 and Mos2 are turned off.

Gate electrodes of the transistors Mos1 and Mos2 are connected to the wiring BRL. The signal OSG is input to the wiring BRL. In response to the signal OSG, the pair of storage circuits ((the transistor Mos1 and the capacitor C101) and (the transistor Mos2 and the capacitor C102)) is driven and backup or recovery operation is performed.

Structures and operations of the pair of storage circuits ((the transistor Mos1 and the capacitor C101) and (the transistor Mos2 and the capacitor C102)) are described below.

The pair of storage circuits ((the transistor Mos1 and the capacitor C101) and (the transistor Mos2 and the capacitor C102)) accumulates charge in the capacitors C101 and C102, so that the potentials of the nodes FN1 and FN2 are held. When the transistors Mos1 and Mos2 are turned on, the node NET1 and the node FN1 are connected and the potential held in the node NET1 is applied to the node FN1. Furthermore, when the transistor Mos2 is turned on, the node NET2 and the node FN2 are connected and the potential held in the node NET2 is applied to the node FN2. In addition, turning off the transistors Mos1 and Mos2 brings the nodes FN1 and FN2 into an electrically floating state, so that charge accumulated in the capacitors C101 and C102 is held and the storage circuits are brought into a data retention state.

For example, in the case where the node FN1 has a high potential, charge may leak from the capacitor C101 and the voltage of the node FN1 might decrease gradually. Each of the transistors Mos1 and Mos2 preferably includes an oxide semiconductor (preferably an oxide containing In, Ga, and Zn) in a channel formation region. Consequently, leakage current flowing between the source and the drain in an off state (off-state current) is extremely low; thus, voltage variation of the node FN1 can be suppressed. That is, the circuit including the transistor Mos1 and the capacitor C101 can be operated as a nonvolatile storage circuit or a storage circuit that can retain data for a long time without power supply. Furthermore, in a similar manner, the circuit including the transistor Mos2 and the capacitor C102 can be used as a backup storage circuit of the volatile storage circuit (the inverters INV101 and INV102 and the transistors M101 and M102).

A transistor described as an example in Embodiment 7 can be used as the transistors Mos1 and Mos2. Because of the low off-state current of the transistors Mos1 and Mos2, the memory cell 600 can retain data for a long time without power supply. The favorable switching characteristics of the transistors Mos1 and Mos2 facilitate backup and recovery operations of the memory cell 600.

As in FIG. 9E, in the structure examples of the memory cells in FIGS. 9A to 9D, each of the transistors Mos3, Mos4, Mos5, and Mos6 preferably includes an oxide semiconductor (preferably an oxide containing In, Ga, and Zn) in a channel formation region. Consequently, off-state current is extremely low; thus, voltage variation of the nodes FN3, FN4, FN5, and FN6 can be suppressed. That is, each of the memory cells 603, 604, 605, and 606 can be operated as a storage circuit that can retain data for a long time without power supply.

The memory cell described in this embodiment and the transistor that includes an oxide semiconductor in a channel formation region and is described as an example in Embodiment 7 are used in the memory 107 described in Embodiment 1, so that it is possible to provide the memory 107 that includes a storage circuit capable of retaining data for a long time without power supply and can have a smaller size, reduced power consumption, a higher speed, or a smaller power supply voltage variation.

N-channel transistors used in the memory cell may each be replaced with the transistor that includes an oxide semiconductor in a channel formation region and is described as an example in Embodiment 7. In particular, by using only a p-channel transistor as the Si-transistor, manufacturing cost can be reduced.

This embodiment can be combined with any of the other embodiments described in this specification as appropriate.

Embodiment 4

In the above sensor system, the CPU is power gated to reduce power consumption. Although a CPU register is formed using a flip-flop, a general flip-flop loses retained data when power supply is stopped. Thus, in order to power gate the CPU, it is necessary to back up data of the flip-flop. In this embodiment, a flip-flop capable of backing up data is described.

Figure 11:
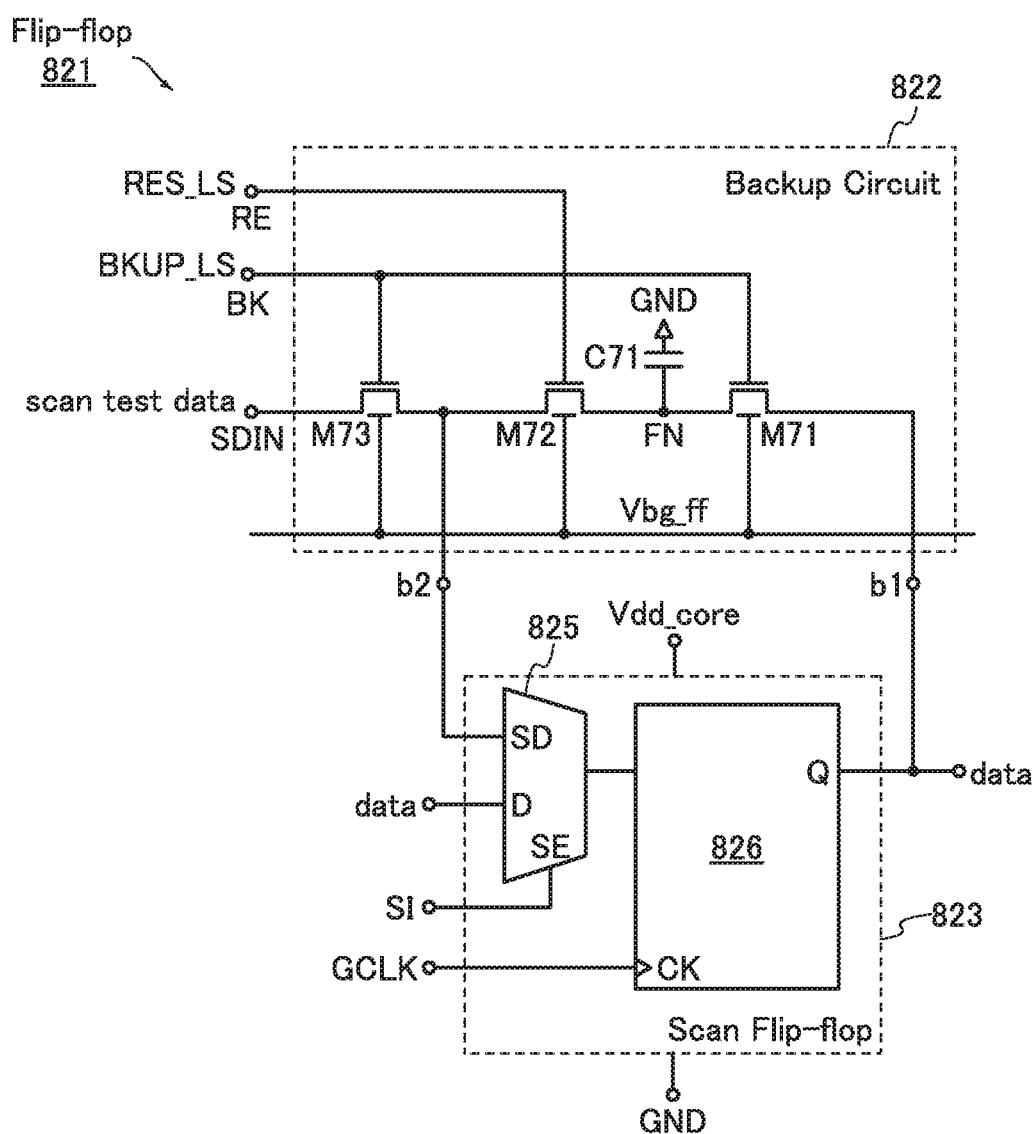
FIG. 11 is a circuit diagram illustrating a structure example of a flip-flop.

FIG. 11 is a circuit diagram illustrating a structure example of a flip-flop. The flip-flop 821 includes a backup circuit 822 and a scan flip-flop 823. In other words, the flip-flop 821 is a flip-flop including a backup circuit. When the flip-flop 821 is provided in a CPU, the CPU can be power gated.

The circuit structure of the scan flip-flop 823 is not particularly limited. A scan flip-flop that is prepared in a circuit library can be used. The scan flip-flop 823 includes nodes D, Q, CK, SD, and SE, a selector 825, and a flip-flop 826. A signal GCLK is input to the node CK. The signal GCLK is a clock signal. A signal SI is input to the node SE. The selector 825 selects either the node D or the node SD depending on the logic of the signal SI and outputs data to be input to the selected node to the flip-flop 826.

A potential Vdd_core and GND are input to the scan flip-flop 823 as power supply potentials. The potential Vdd_core is supplied to the scan flip-flop 823 through a power switch.

The backup circuit 822 includes nodes RE, BK, SDIN, FN, b1, and b2, transistors M71 to M73, and a capacitor C71. The node FN is a data retention node. The capacitor C71 is electrically connected to the node FN. The node b1 is electrically connected to the node Q. The node b2 is electrically connected to the node SD. A backup signal (BKUP_LS) is input to the node BK, and a restore signal (RES_LS) is input to the node RE.

The transistors M71 to M73 are OS transistors each including a back gate. A potential Vbg_ff is input to these back gates. Gates of the transistors M71 and M73 are electrically connected to the node BK, and a gate of the transistor M72 is electrically connected to the node RE. Since the backup circuit 822 does not include any Si transistors, the backup circuit 822 can be stacked over the scan flip-flop 823 formed using a Si transistor.

Figure 12A:
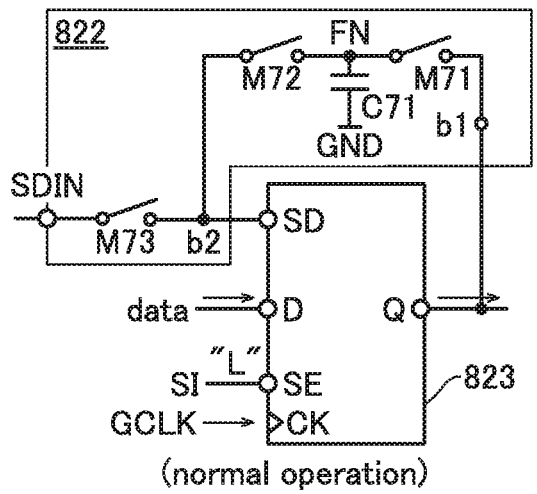
FIGS. 12A to 12C are circuit diagrams illustrating an operation example of a flip-flop.
Figure 12B:
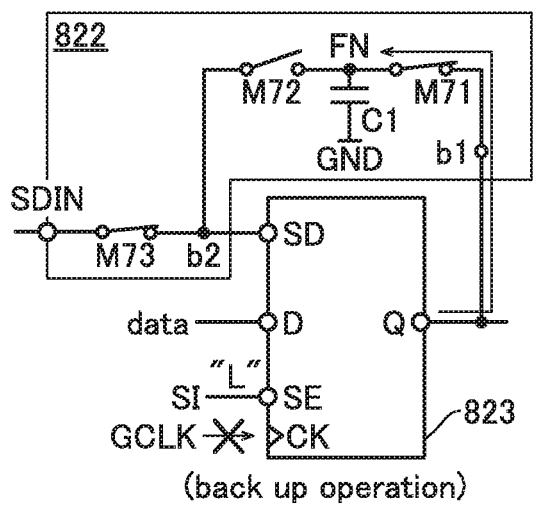
Figure 12C:
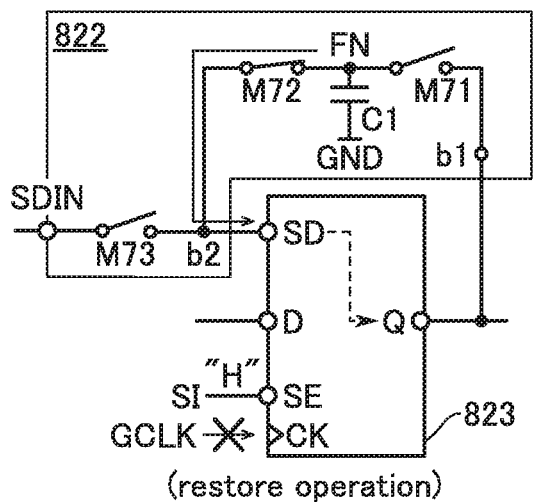

An operation example of the flip-flop 821 is described with reference to circuit diagrams in FIGS. 12A to 12C. In FIGS. 12A to 12C, the transistors M71 to M73 are denoted by switches.

<Normal Operation>

FIG. 12A illustrates an operation example of the flip-flop 821 in an active mode, where the flip-flop 821 performs normal operation. The flip-flop 821 takes data input from the node D and outputs retained data from the node Q in synchronization with the rise (or fall) of the signal GCLK. Since the flip-flop 821 takes data from the node D, the "L" (low-level) signal SI is input to the node SE. Since the signals BKUP_LS and RES_LS are at "L," the transistors M71 to M73 are off.

<Backup Operation>

Before supply of power to the CPU is stopped, data of the scan flip-flop 823 is backed up to the backup circuit 822. First, input of the signal GCLK is stopped. The logic of the node Q is determined by this clock gating. Next, the "H" signal BKUP_LS is input to the node BK to turn on the transistors M71 and M73 (FIG. 12(B)). Since the node FN is electrically connected to the node Q, the logic of the node FN is the same as that of the node Q. When the logic of the node Q is "1," the logic of the node FN is also "1." When the logic of the node Q is "0," the logic of the node FN is also "0."

Next, the "L" signal BKUP_LS is input to the node BK to turn off the transistor M71. Thus, the node FN is brought into an electrically floating state to terminate the backup operation. After the backup operation, supply of power to the potential Vdd_core to the scan flip-flop 823 is stopped as necessary. Since the transistors M71 and M72 are OS transistors that have extremely low off-state current, the backup circuit 822 can retain data for a long time. Off-state current refers to leakage current flowing between the source and the drain when a transistor is in an off state.

<Restore Operation>

When the supply of power to the CPU is restarted, data restore operation of the scan flip-flop 823 is started. The supply of the potential Vdd_core to the scan flip-flop 823 is restarted by operation of the power switch. Next, the "H" signal SI is input to the node SE so that data of the node SD is input to the scan flip-flop 823. The "H" signal RES_LS is input to the node RE to turn on the transistor M72. The node FN is electrically connected to the node SD, so that data of the node FN is written to the node SD (FIG. 12(C)). Then, the signal GCLK for one cycle is input to write the data of the node SD to the node Q.

The "L" signal RES_LS is input to the node RE to turn off the transistor M72; thus, the restore operation is terminated. The state of the scan flip-flop 823 is restored so that the scan flip-flop 823 can output data whose logic is the same as the logic of data of the node Q immediately after the stop of the input of the signal GCLK. The scan flip-flop 823 starts normal operation by restart of the input of the signal GCLK.

Since the transistors M71 and M72 are OS transistors that have extremely low off-state current, the backup circuit 822 can retain data for a long time. Input of a negative potential to the back gates of the transistors M71 and M72 is effective in increasing data retention time because cutoff current of the transistors M71 and M72 can be reduced.

When the transistors M71 to M73 are OS transistors, the transistors M71 to M73 can be stacked over the scan flip-flop 823. Thus, the backup circuit 822 can be provided without any change in design and layout of the scan flip-flop 823. Consequently, the area overhead due to the backup circuit 822 can be substantially zero.

The flip-flop 821 can back up and restore data at high speed. For example, the flip-flop 821 can complete backup operation and restore operation within several clock cycles. The backup operation and the restore operation correspond to charging and discharging of the node FN by switching operation of the transistors M71 and M72; thus, energy required for these operations is low as in the case of a DRAM cell. In addition, since the backup circuit 822 does not consume power for data retention, the standby power of the flip-flop 821 can be reduced. Supply of power to the backup circuit 822 is not needed in normal operation; thus, even when the backup circuit 822 is provided, the dynamic power of the flip-flop 821 is not increased substantially.

Note that when the backup circuit 822 is provided, parasitic capacitance of the transistor M71 is added to the node Q. However, the parasitic capacitance of the transistor M71 is lower than parasitic capacitance due to a logic circuit connected to the node Q; thus, the influence of the parasitic capacitance of the transistor M71 on the normal operation of the flip-flop 821 is negligible. In other words, even when the backup circuit 822 is provided, there is no substantial decrease in the performance of the flip-flop 821 in the active mode.

This embodiment can be combined with any of the other embodiments described in this specification as appropriate.

Embodiment 5

In the sensor system, a vibration power generator is used as a power source. An electromagnetic induction vibration power generation method, a piezoelectric vibration power generation method, a capacitive vibration power generation method, and the like are known as vibration power generation methods. In this embodiment, a capacitive vibration power generation method with an electret is described. Here, the electret means a substance where a dielectric polarizer remains even without any electric fields and forms an electric field semipermanently.

Figure 13A:
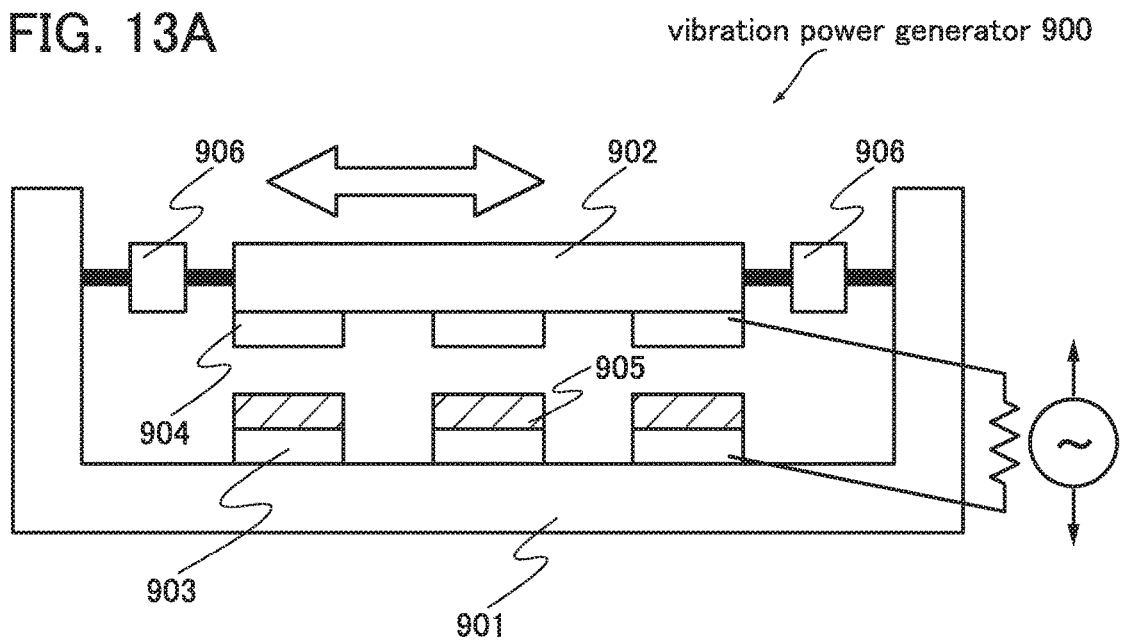
FIGS. 13A and 13B are schematic diagrams illustrating a structure example and an operation example of a vibration power generator.

FIG. 13A illustrates a structure example of a vibration power generator. A vibration power generator 900 includes a fixed substrate 901, a movable substrate 902, fixed electrodes 903, counter electrodes 904, electrets 905, and springs 906. Although the springs 906 make the movable substrate 902 movable in FIG. 13A, the movable substrate 902 may be made movable by a method other than the method of using the springs.

When there are no vibrations, the counter electrodes 904 are provided above the fixed electrodes 903 and the electrets 905. Since the electrets 905 form electric fields, charges are drawn toward the counter electrodes 904, and the counter electrodes 904 are charged with electricity.

Figure 13B:
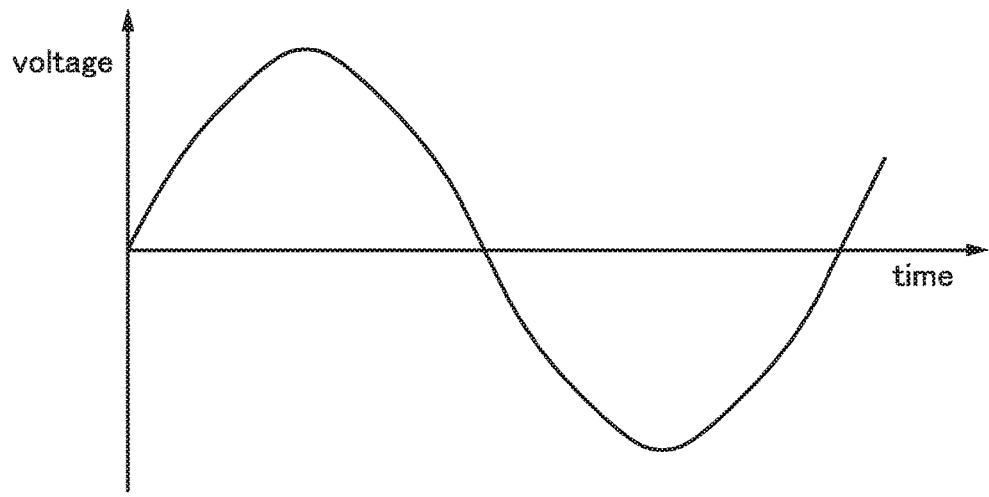

When vibration is applied in this state, the overlap area of the electret 905 and the counter electrode 904 is changed. When the overlap area of the electret 905 and the counter electrode 904 is decreased, the amount of charges that are drawn toward the counter electrodes 904 is also decreased. Thus, charges flow to a load, so that voltage is generated. DC voltage can be obtained by rectifying the voltage. FIG. 13B illustrates an example of voltage generated when the overlap area of the electret 905 and the counter electrode 904 is changed.

Embodiment 6

In this embodiment, an IC chip, an electronic component, electronic devices, and the like are described as examples of a semiconductor device.

<Example of Manufacturing Method of Electronic Component>

Figure 14A:
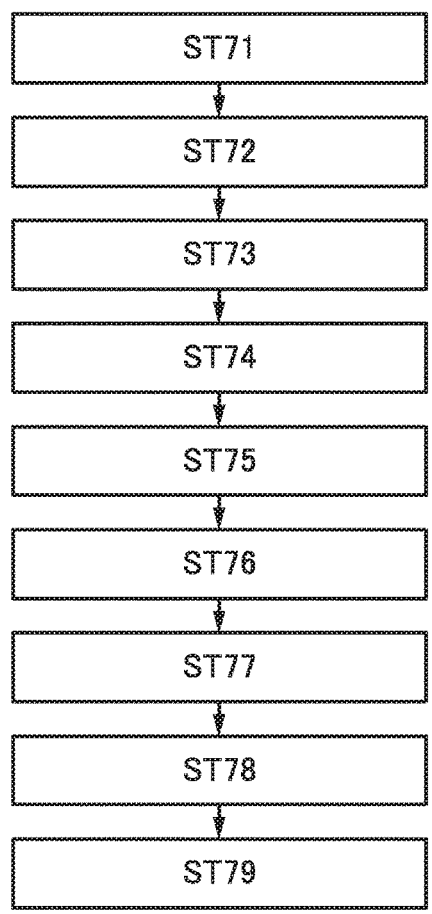
FIG. 14A is a flow chart showing an example of a method for manufacturing an electronic component.

FIG. 14A is a flow chart showing an example of a method for manufacturing an electronic component. The electronic component is also referred to as a semiconductor package or an IC package. This electronic component has a plurality of standards and names depending on a terminal extraction direction and a terminal shape. Examples of the electronic component are described in this embodiment.

A semiconductor device including a transistor is completed by integrating detachable components on a printed wiring board through an assembly process (post-process). The post-process can be finished through steps in FIG. 14A. Specifically, after an element substrate obtained in a wafer process is completed (step ST71), a rear surface of the substrate is ground. The substrate is thinned in this step to reduce warpage or the like of the substrate in the wafer process and to reduce the size of the electronic component. Next, the substrate is divided into a plurality of chips in a dicing step (step ST72).

Figure 14B:
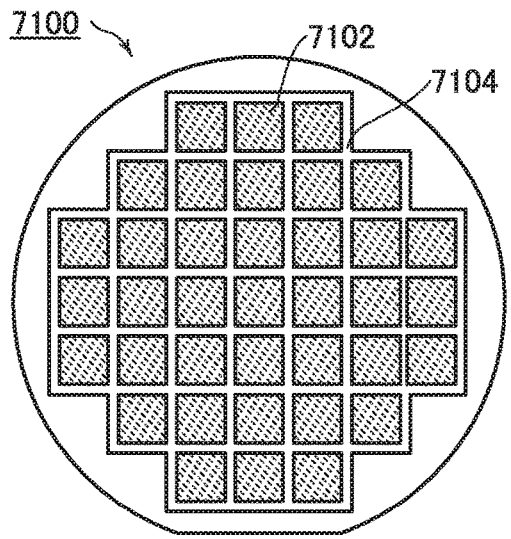
FIGS. 14B to 14E are schematic views illustrating a structure example of the electronic component.
Figure 14C:
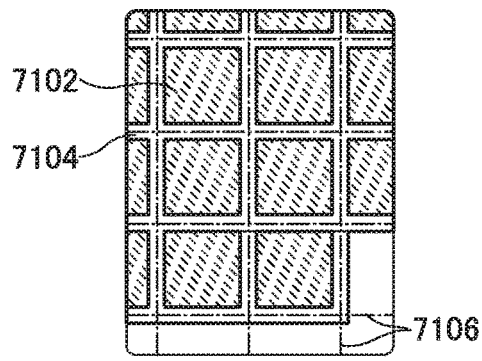

FIG. 14B is a top view of a semiconductor wafer 7100 before the dicing step. FIG. 14C is a partial enlarged view of FIG. 14B. A plurality of circuit regions 7102 are provided over the semiconductor wafer 7100. The semiconductor device in one embodiment of the present invention (e.g., a memory, a timer, or a CPU) is provided in the circuit region 7102.

Figure 14D:
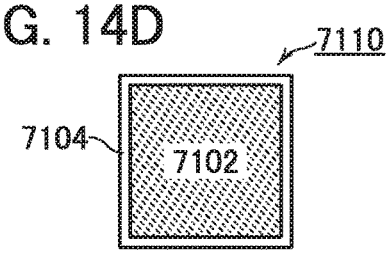

The plurality of circuit regions 7102 are each surrounded by a separation region 7104. Separation lines (also referred to as dicing lines) 7106 are set at a position overlapping with the separation regions 7104. The semiconductor wafer 7100 is cut along the separation lines 7106 into chips 7110 including the circuit regions 7102 in the dicing step (step ST72). FIG. 14D is an enlarged view of the chip 7110.

A conductive layer or a semiconductor layer may be provided in the separation regions 7104. Providing a conductive layer or a semiconductor layer in the separation regions 7104 relieves ESD that might be caused in the dicing step, which prevents a decrease in yield caused by the dicing step. A dicing step is generally performed while supplying pure water whose specific resistance is decreased by dissolution of a carbonic acid gas or the like to a cut portion, in order to cool down a substrate, remove swarf, and prevent electrification, for example. Providing a conductive layer or a semiconductor layer in the separation regions 7104 allows a reduction in the usage of pure water. Therefore, the cost of manufacturing semiconductor devices can be reduced. In addition, semiconductor devices can be manufactured with improved productivity.

After Step ST72, the divided chips are separately picked up to be mounted on and bonded to a lead frame in a die bonding step (step ST73). In the die bonding step, the chip is bonded to the lead frame by an appropriate method depending on a product, for example, bonding with a resin or a tape. In the die bonding step, the chip may be mounted on an interposer to be bonded. In a wire bonding step, lead of the lead frame is electrically connected to an electrode on the chip with a metal fine line (wire) (step ST74). A silver line or a gold line can be used as the metal fine line. Either ball bonding or wedge bonding may be used as wire bonding.

A molding step is performed to seal the wire bonded chip with an epoxy resin or the like (step ST75). With the molding step, the electronic component is filled with the resin, so that damage to a mounted circuit portion or wire due to mechanical external force can be reduced. Furthermore, degradation in characteristics due to moisture or dust can be reduced. The lead of the lead frame is plated. After that, the lead is cut and processed (step ST76). This plating step prevents rust of the lead and facilitates soldering at the time of mounting the chip on a printed wiring board in a later step. Printing (marking) is performed on a surface of the package (step ST77). Through an inspection step (step ST78), the electronic component is completed (step ST79). When the electronic component includes the semiconductor device described in the above embodiment, a low-power small electronic component can be provided.

Figure 14E:
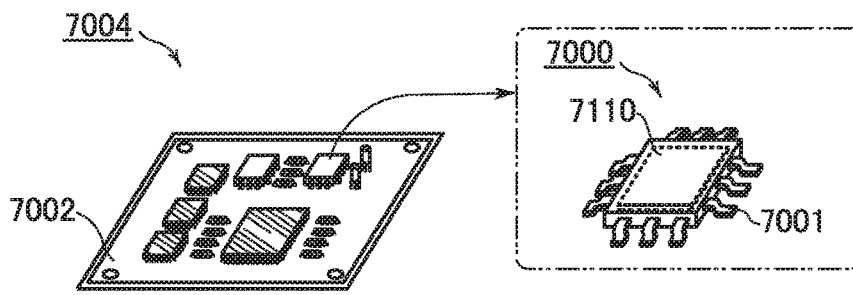

FIG. 14E is a schematic perspective view of the completed electronic component. FIG. 14E illustrates a schematic perspective view of a quad flat package (QFP) as an example of the electronic component. As illustrated in FIG. 14E, an electronic component 7000 includes a lead 7001 and a chip 7110.

The electronic component 7000 is mounted on a printed wiring board 7002, for example. When a plurality of electronic components 7000 are used in combination and electrically connected to each other over the printed wiring board 7002, the electronic components 7000 can be mounted on an electronic device. A completed circuit board 7004 is provided in the electronic device or the like. When an electronic device includes the electronic component 7000, the power consumption of the electronic device can be reduced. Alternatively, the electronic device can have smaller size.

Embodiment 7

In this embodiment, an oxide semiconductor and the like are described.
<Structure Example 1 of OS Transistor>
FIG. 15A is a top view illustrating a structure example of an OS transistor. FIG. 15B is a cross-sectional view taken along line X1-X2 in FIG. 15A. FIG. 15C is a cross-sectional view taken along line Y1-Y2 in FIG. 15A. In some cases, the direction of line X1-X2 is referred to as a channel length direction, and the direction of line Y1-Y2 is referred to as a channel width direction. Accordingly, FIG. 15B illustrates a cross-sectional structure of the OS transistor in the channel length direction, and FIG. 15C illustrates a cross-sectional structure of the OS transistor in the channel width direction. Note that to clarify the device structure, FIG. 15A does not illustrate some components.

An OS transistor 501 is formed over an insulating surface, here, over an insulating layer 521. The OS transistor 501 is covered with insulating layers 528 and 529. The OS transistor 501 includes insulating layers 522 to 527, metal oxide layers 511 to 513, and conductive layers 550 to 553.

Note that an insulating layer, a metal oxide layer, a conductor, and the like in a drawing may have a single-layer structure or a layered structure. These elements can be formed by any of a variety of deposition methods such as sputtering, molecular beam epitaxy (MBE), pulsed laser ablation (PLA), CVD, and atomic layer deposition (ALD). Examples of CVD include plasma-enhanced CVD, thermal CVD, and metal organic CVD.

The metal oxide layers 511 to 513 are collectively referred to as an oxide layer 510. As illustrated in FIGS. 15B and 15C, the oxide layer 510 includes a portion where the metal oxide layer 511, the metal oxide layer 512, and the metal oxide layer 513 are stacked in that order. When the OS transistor 501 is on, a channel is mainly formed in the metal oxide layer 512 of the oxide layer 510.

A gate electrode of the OS transistor 501 is formed using the conductive layer 550. A pair of electrodes that functions as a source electrode and a drain electrode of the OS transistor 501 is formed using the conductive layers 551 and 552. A back gate electrode of the OS transistor 501 is formed using the conductive layer 553. The conductive layer 553 includes conductive layers 553a and 553b. Note that the OS transistor 501 does not necessarily include a back gate electrode. The same applies to OS transistors 502 to 507 to be described later.

A gate insulating layer on a gate (front gate) side is formed using the insulating layer 527. A gate insulating layer on a back gate side is formed using a stack of the insulating layers 524 to 526. The insulating layer 528 is an interlayer insulating layer. The insulating layer 529 is a barrier layer.

The metal oxide layer 513 covers a stack of the metal oxide layers 511 and 512 and the conductive layers 551 and 552. The insulating layer 527 covers the metal oxide layer 513. The conductive layers 551 and 552 each include a region that overlaps with the conductive layer 550 with the metal oxide layer 513 and the insulating layer 527 positioned therebetween.

The conductive layers 551 and 552 are formed using a hard mask used for forming the stack of the metal oxide layers 511 and 512. For example, the metal oxide layers 511 and 512 and the conductive layers 551 and 552 can be formed through the following steps. A two-layer metal oxide film is formed. A conductive film is formed over the metal oxide film. This conductive film is etched, so that a hard mask is formed. With the use of this hard mask, the two-layer metal oxide film is etched to form the stack of the metal oxide layers 511 and 512. Then, the hard mask is etched to form the conductive layers 551 and 552. Since the conductive layers 551 and 552 are formed through these steps, the conductive layers 551 and 552 do not include regions that are in contact with side surfaces of the metal oxide layers 511 and 512.
<Conductive Layer>
Examples of a conductive material used for the conductive layers 550 to 553 include a semiconductor typified by polycrystalline silicon doped with an impurity element such as phosphorus; silicide such as nickel silicide; a metal such as molybdenum, titanium, tantalum, tungsten, aluminum, copper, chromium, neodymium, or scandium; and a metal nitride containing any of the above metals as its component (tantalum nitride, titanium nitride, molybdenum nitride, or tungsten nitride). A conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can be used.

With the use of a conductive material with a high work function for the conductive layer 550, it is possible to increase Vth of the OS transistor 501 and reduce cutoff current. For the conductive layer 550, a conductive material whose work function is preferably higher than or equal to 4.8 eV, more preferably higher than or equal to 5.0 eV, still more preferably higher than or equal to 5.2 eV, yet more preferably higher than or equal to 5.4 eV, still more preferably higher than or equal to 5.6 eV can be used. Examples of the conductive material with a high work function include molybdenum, molybdenum oxide, Pt, Pt silicide, Ni silicide, indium tin oxide, and an In—Ga—Zn oxide to which nitrogen is added.

Note that the cutoff current refers to current between the source and the drain when gate-source voltage is 0 V.

For example, the conductive layer 550 is a single layer of tantalum nitride or tungsten. Alternatively, in the case where the conductive layer 550 has a two-layer structure or a three-layer structure, the following combinations can be used: aluminum and titanium; titanium nitride and titanium; titanium nitride and tungsten; tantalum nitride and tungsten; tungsten nitride and tungsten; titanium, aluminum, and titanium; titanium nitride, aluminum, and titanium; and titanium nitride, aluminum, and titanium nitride. The conductor described first is used for a layer on the insulating layer 527 side.

The conductive layers 551 and 552 have the same layer structure. For example, in the case where the conductive layer 551 is a single layer, any of metals such as aluminum, titanium, chromium, nickel, copper, yttrium, zirconium, molybdenum, silver, tantalum, and tungsten, or an alloy containing any of these metals as its main component may be used. Alternatively, in the case where the conductive layer 551 has a two-layer structure or a three-layer structure layer, the following combinations can be used: titanium and aluminum; tungsten and aluminum; tungsten and copper; a copper-magnesium-aluminum alloy and copper; a titanium film and copper; titanium or titanium nitride, aluminum or copper, and titanium or titanium nitride; and molybdenum or molybdenum nitride, aluminum or copper, and molybdenum or molybdenum nitride. The conductor described first is used for a layer on the insulating layer 527 side.

For example, it is preferable that the conductive layer 553*a* be a conductive layer that has a hydrogen barrier property (e.g., a tantalum nitride layer) and that the conductive layer 553*b* be a conductive layer that has higher conductivity than the conductive layer 553*a* (e.g., tungsten). With such a structure, the conductive layer 553 functions as a wiring and has a function of suppressing diffusion of hydrogen into the oxide layer 510.

<Insulator>

Examples of insulating materials used for the insulating layers 521 to 529 include aluminum nitride, aluminum oxide, aluminum nitride oxide, aluminum oxynitride, magnesium oxide, silicon nitride, silicon oxide, silicon nitride oxide, silicon oxynitride, gallium oxide, germanium oxide, yttrium oxide, zirconium oxide, lanthanum oxide, neodymium oxide, hafnium oxide, tantalum oxide, and aluminum silicate. The insulating layers 521 to 529 are formed using a single-layer structure or a layered structure of these insulating materials. The layers used for the insulating layers 521 to 529 may include a plurality of insulating materials.

Note that in this specification and the like, an oxynitride refers to a substance that contains more oxygen than nitrogen, and a nitride oxide refers to a substance that contains more nitrogen than oxygen.

In order to suppress the increase in oxygen vacancies in the oxide layer 510, the insulating layers 526 to 528 preferably include oxygen. More preferably, at least one of the insulating layers 526 to 528 is formed using an insulating film from which oxygen is released by heating (hereinafter such an insulating film is referred to as an insulating film containing excess oxygen). When oxygen is supplied from the insulating film containing excess oxygen to the oxide layer 510, the oxygen vacancies in the oxide layer 510 can be compensated. Thus, reliability and electrical characteristics of the OS transistor 501 can be improved.

The insulating film containing excess oxygen is a film from which oxygen molecules at more than or equal to $1.0 \times 10^{18}$ molecules/cm$^3$ are released in thermal desorption spectroscopy (TDS) at a surface temperature of the film of higher than or equal to 100° C. and lower than or equal to 700° C., or higher than or equal to 100° C. and lower than or equal to 500° C. The amount of released oxygen molecules is preferably more than or equal to $3.0 \times 10^{20}$ atoms/cm$^3$.

The insulating film containing excess oxygen can be formed by performing treatment for adding oxygen to an insulating film. The treatment for adding oxygen can be performed by heat treatment in an oxygen atmosphere, ion implantation, ion doping, plasma immersion ion implantation, plasma treatment, or the like. As a gas for adding oxygen, an oxygen gas of $^{16}O_2$, $^{18}O_2$, or the like, a nitrous oxide gas, an ozone gas, or the like can be used.

The concentration of hydrogen in the insulating layers 521 to 529 is preferably low in order to prevent the increase in the concentration of hydrogen in the oxide layer 510. In particular, the concentration of hydrogen in the insulating layers 523 to 528 is preferably low. Specifically, the concentration of hydrogen is lower than or equal to $2 \times 10^{20}$ atoms/cm$^3$, preferably lower than or equal to $5 \times 10^{19}$ atoms/cm$^3$, more preferably lower than or equal to $1 \times 10^{19}$ atoms/cm$^3$, still more preferably lower than or equal to $5 \times 10^{18}$ atoms/cm$^3$.

The concentration of nitrogen in the insulating layers 523 to 528 is preferably low in order to prevent the increase in the concentration of nitrogen in the oxide layer 510. Specifically, the concentration of nitrogen is lower than $5 \times 10^{19}$ atoms/cm$^3$, preferably lower than or equal to $5 \times 10^{18}$ atoms/cm$^3$, more preferably lower than or equal to $1 \times 10^{18}$ atoms/cm$^3$, still more preferably lower than or equal to $5 \times 10^{17}$ atoms/cm$^3$.

The hydrogen concentration and the nitrogen concentration are measured by secondary ion mass spectrometry (SIMS).

In the OS transistor 501, the oxide layer 510 is preferably surrounded by an insulating layer with oxygen and hydrogen barrier properties (hereinafter such an insulating layer is referred to as a barrier layer). With such a structure, it is possible to suppress the release of oxygen from the oxide layer 510 and entry of hydrogen into the oxide layer 510; thus, the reliability and electrical characteristics of the OS transistor 501 can be improved.

For example, the insulating layer 529 functions as a barrier layer and at least one of the insulating layers 521, 522, and 524 functions as a barrier layer. The barrier layer can be formed using a material such as aluminum oxide, aluminum oxynitride, gallium oxide, gallium oxynitride, yttrium oxide, yttrium oxynitride, hafnium oxide, hafnium oxynitride, or silicon nitride.

In addition, a barrier layer may be provided between the oxide layer 510 and the conductive layer 550. Alternatively, a metal oxide layer that has oxygen and hydrogen barrier properties may be provided as the metal oxide layer 513.

The film thicknesses of the insulating layer 524, the insulating layer 525, and the insulating layer 526 are preferably reduced so that the threshold voltage of the OS transistor can be easily controlled with the voltage of the conductive layer 550. For example, the film thicknesses of the insulating layers 524 to 526 are each smaller than or equal to 50 nm. The film thicknesses of the insulating layers 524 to 526 are each preferably smaller than or equal to 30 nm, more preferably smaller than or equal to 10 nm, still more preferably smaller than or equal to 5 nm.

A structure example of the insulating layers 521 to 529 is described. In this example, each of the insulating layers 521, 522, 525, and 529 functions as a barrier layer. The insulating layers 526 to 528 are oxide layers containing excess oxygen. The insulating layer 521 is formed using silicon nitride. The insulating layer 522 is formed using aluminum oxide. The insulating layer 523 is formed using silicon oxynitride. The gate insulating layers (524 to 526) on the back gate side are formed using a stack of silicon oxide, aluminum oxide, and silicon oxide. The gate insulating layer (527) on the front gate side is formed using silicon oxynitride. The interlayer insulating layer (528) is formed using silicon oxide. The insulating layer 529 is formed using aluminum oxide.

<Metal Oxide Layer>

The thickness of each of the metal oxide layers 511 to 513 is larger than or equal to 3 nm and smaller than or equal to 500 nm, preferably larger than or equal to 3 nm and smaller than or equal to 100 nm, more preferably larger than or equal to 3 nm and smaller than or equal to 60 nm.

In order to reduce the off-state current of the OS transistor 501, for example, the energy gap of the metal oxide layer 512 is preferably large. The energy gap of the metal oxide layer 512 is greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The oxide layer 510 is preferably a crystalline metal oxide layer. In the oxide layer 510, at least the metal oxide layer 512 is preferably a crystalline metal oxide layer. The OS transistor 501 can have high reliability and favorable electrical characteristics.

As the oxide of the metal oxide layer 512, typically, an In—Ga oxide, an In—Zn oxide, or an In-M-Zn oxide (M is Al, Ga, Y, or Sn) can be used. The metal oxide layer 512 is not limited to the oxide layer containing indium. The metal oxide layer 512 can be formed using a Zn—Sn oxide, a Ga—Sn oxide, or a Zn—Mg oxide, for example. The metal oxide layers 511 and 513 can be formed using an oxide that is similar to the oxide of the metal oxide layer 512. The metal oxide layers 511 and 513 can be formed using a Ga oxide. In that case, the metal oxide layer 512 is preferably a metal oxide layer containing Ga.

When an interface level is formed at an interface between the metal oxide layer 512 and the metal oxide layer 511, a channel region is also formed in a region close to the interface; thus, the threshold voltage of the OS transistor 501 varies. It is preferable that the metal oxide layer 511 contains at least one of the metal elements contained in the metal oxide layer 512. Accordingly, an interface state is hardly formed at the interface between the metal oxide layer 512 and the metal oxide layer 513, and variations in the electrical characteristics of the OS transistor 501, such as the threshold voltage, can be reduced.

The metal oxide layer 513 preferably contains at least one of the metal elements contained in the metal oxide layer 512 because interface scattering is unlikely to occur at the interface between the metal oxide layer 512 and the metal oxide layer 513, and carrier transfer is not inhibited. Thus, the field-effect mobility of the OS transistor 501 can be increased.

It is preferable that the metal oxide layer 512 have the highest carrier mobility among the metal oxide layers 511 to 513. Accordingly, a channel can be formed in the metal oxide layer 512 that is apart from the insulating layers 526 and 527.

For example, in a metal oxide containing In such as an In-M-Zn oxide, carrier mobility can be increased by an increase in the In content. In the In-M-Zn oxide, the s orbital of heavy metal mainly contributes to carrier transfer, and when the indium content in the oxide semiconductor is increased, overlaps of the s orbitals of In atoms are increased; therefore, an oxide having a high content of indium has higher mobility than an oxide having a low content of indium. Therefore, an oxide having a high content of indium is used as an oxide semiconductor film, so that carrier mobility can be increased.

For example, the metal oxide layer 512 is formed using an In—Ga—Zn oxide, and the metal oxide layers 511 and 513 are formed using a Ga oxide. For example, in the case where the metal oxide layers 511 to 513 are formed using an In-M-Zn oxide, the metal oxide layer 511 has the highest In content among the metal oxide layers 511 to 513. In the case where the In-M-Zn oxide is formed by sputtering, the In content can be changed by a change in the atomic ratio of metal elements of a target.

For example, it is preferable that the atomic ratio of metal elements of a target used for depositing the metal oxide layer 512 be In:M:Zn=1:1:1, 3:1:2, or 4:2:4.1. For example, it is preferable that the atomic ratio of metal elements of a target used for depositing the metal oxide layers 511 and 513 be In:M:Zn=1:3:2 or 1:3:4. The atomic ratio of an In-M-Zn oxide deposited using a target of In:M:Zn=4:2:4.1 is approximately In:M:Zn=4:2:3.

In order that the OS transistor 501 have stable electrical characteristics, it is preferable to reduce the concentration of impurities in the oxide layer 510. In the metal oxide, hydrogen, nitrogen, carbon, silicon, and a metal element other than a main component are impurities. For example, hydrogen and nitrogen form donor levels to increase the carrier density, and silicon and carbon form impurity levels in the oxide semiconductor. The impurity levels serve as traps and might cause deterioration in the electric characteristics of the OS transistor.

For example, the oxide layer 510 includes a region where the concentration of silicon is lower than or equal to $2\times10^{18}$ atoms/cm$^3$. The concentration of silicon in the region is preferably lower than or equal to $2\times10^{17}$ atoms/cm$^3$. The same applies to the concentration of carbon in the oxide layer 510.

The oxide layer 510 includes a region where the concentration of alkali metal is lower than or equal to $1\times10^{18}$ atoms/cm$^3$. The concentration of alkali metal in the region is preferably lower than or equal to $2\times10^{16}$ atoms/cm$^3$. The same applies to the concentration of alkaline earth metal in the oxide layer 510.

The oxide layer 510 includes a region where the concentration of nitrogen is lower than $5\times10^{19}$ atoms/cm$^3$. The concentration of nitrogen in the region is preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$.

The oxide layer 510 includes a region where the concentration of hydrogen is lower than $1\times10^{20}$ atoms/cm$^3$. The concentration of hydrogen in the region is preferably lower than $1\times10^{19}$ atoms/cm$^3$, more preferably lower than $5\times10^{18}$ atoms/cm$^3$, still more preferably lower than $1\times10^{18}$ atoms/cm$^3$.

The concentrations of the impurities in the oxide layer 510 are measured by SIMS.

In the case where the metal oxide layer 512 contains oxygen vacancies, donor levels are formed by entry of hydrogen into sites of oxygen vacancies in some cases. As a result, the on-state current of the OS transistor 501 is decreased. Sites of oxygen vacancies become more stable by entry of oxygen than by entry of hydrogen. Thus, by decreasing oxygen vacancies in metal oxide layer 512, the on-state current of the OS transistor 501 can be increased in some cases. Consequently, preventing entry of hydrogen into sites of oxygen vacancies by a reduction in hydrogen in the metal oxide layer 512 is effective in improving on-state current characteristics.

Hydrogen contained in a metal oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, the OS transistor 501 is likely to be normally-on when the metal oxide layer 512 contains hydrogen because the metal oxide layer 512 includes a channel formation region. Accordingly, it is preferable that hydrogen in the metal oxide layer 512 be reduced as much as possible.

FIGS. 15A to 15C illustrate examples in which the oxide layer 510 has a three-layer structure; however, one embodiment of the present invention is not limited thereto. For example, the oxide layer 510 may have a two-layer structure without the metal oxide layer 511 or 513. Alternatively, the oxide layer 510 may have a four-layer structure in which any one of the oxide semiconductor layers described as the metal oxide layers 511 to 513 is provided below or over the metal oxide layer 511 or below or over the metal oxide layer 513. Alternatively, the oxide layer 510 may include one or more metal oxide layers that are similar to the metal oxide layers 511 to 513 at two or more of the following positions: between given layers in the oxide layer 510, over the oxide layer 510, and below the oxide layer 510.

<Energy Band Structure>

Figure 22:
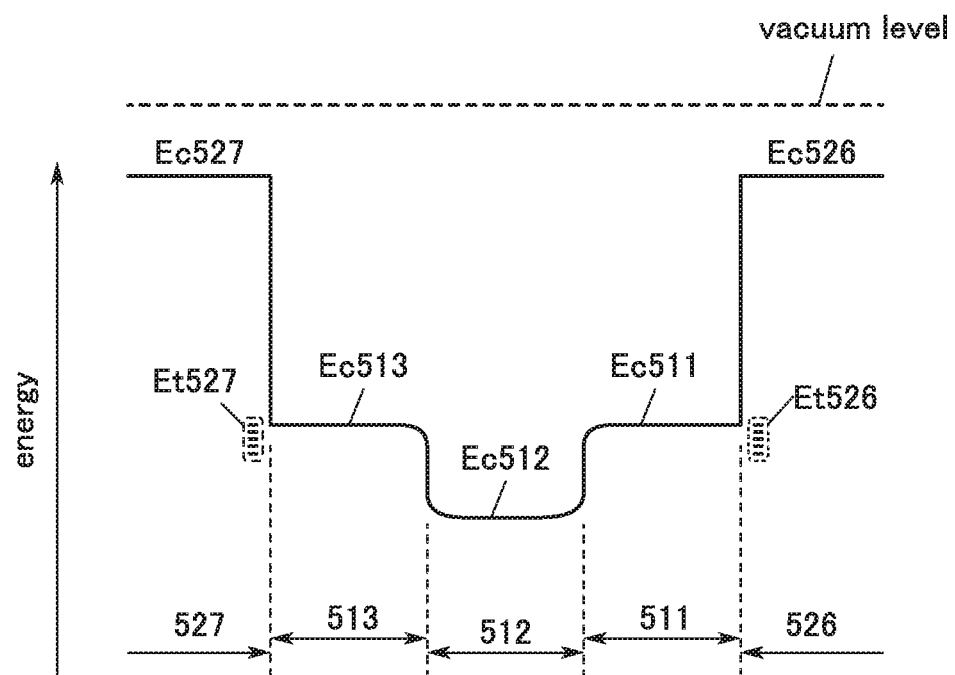
FIG. 22 is a schematic diagram showing an energy band structure.

Effects of the stack of the metal oxide layers 511 to 513 are described with reference to FIG. 22. FIG. 22 is a schematic diagram showing the energy band structure of a channel formation region of the OS transistor 501. Although the OS transistor 501 is described here as an example, effects of the stack of the metal oxide layers 511 to 513 in the OS transistors 502 and 503 to be described later are similar to those in the OS transistor 501.

Here, Ec526, Ec511, Ec512, Ec513, and Ec527 indicate the energy at the bottom of the conduction band of the insulating layer 526, the metal oxide layer 511, the metal oxide layer 512, the metal oxide layer 513, and the insulating layer 527, respectively.

Here, a difference in energy between the vacuum level and the bottom of the conduction band (the difference is also referred to as electron affinity) corresponds to a value obtained by subtracting an energy gap from a difference in energy between the vacuum level and the top of the valence band (the difference is also referred to as an ionization potential). The energy gap can be measured using a spectroscopic ellipsometer (UT-300 manufactured by HORIBA JOBIN YVON S.A.S.). The difference in energy between the vacuum level and the top of the valence band can be measured using an ultraviolet photoelectron spectroscopy (UPS) device (VersaProbe manufactured by ULVAC-PHI, Inc.).

Since the insulating layers 526 and 527 are insulators, Ec526 and Ec527 are closer to the vacuum level than Ec511, Ec512, and Ec513 (i.e., the insulating layers 526 and 527 have a lower electron affinity than the metal oxide layers 511 to 513).

The metal oxide layer 512 has a higher electron affinity than the metal oxide layers 511 and 513. For example, the difference in electron affinity between the metal oxide layers 511 and 512 and the difference in electron affinity between the metal oxide layers 512 and 513 are each greater than or equal to 0.07 eV and less than or equal to 1.3 eV. The difference in electron affinity between the metal oxide layers 511 and 512 and the difference in electron affinity between the metal oxide layers 512 and 513 are each preferably greater than or equal to 0.1 eV and less than or equal to 0.7 eV, more preferably greater than or equal to 0.15 eV and less than or equal to 0.4 eV. Note that the electron affinity is a difference in energy between the vacuum level and the bottom of the conduction band.

When voltage is applied to the gate electrode (the conductive layer 550) of the OS transistor 501, a channel is mainly formed in the metal oxide layer 512 having the highest electron affinity among the metal oxide layers 511 to 513.

An indium gallium oxide has low electron affinity and a high oxygen-blocking property. Therefore, the metal oxide layer 513 preferably includes an indium gallium oxide. The gallium atomic ratio [Ga/(In+Ga)] is, for example, higher than or equal to 70%, preferably higher than or equal to 80%, more preferably higher than or equal to 90%.

In some cases, there is a mixed region of the metal oxide layers 511 and 512 between the metal oxide layers 511 and 512. Furthermore, in some cases, there is a mixed region of the metal oxide layers 512 and 513 between the metal oxide layers 512 and 513. Because the mixed region has low interface state density, a stack of the metal oxide layers 511 to 513 (the oxide layer 510) has a band structure where energy at each interface and in the vicinity of the interface is changed continuously (continuous junction).

Electrons transfer mainly through the metal oxide layer 512 in the oxide layer 510 having such an energy band structure. Therefore, even when an interface state exists at an interface between the metal oxide layer 511 and the insulating layer 526 or an interface between the metal oxide layer 513 and the insulating layer 527, electron movement in the oxide layer 510 is less likely to be inhibited and the on-state current of the OS transistor 501 can be increased.

Although trap states Et526 and Et527 due to impurities or defects might be formed in the vicinity of the interface between the metal oxide layer 511 and the insulating layer 526 and the vicinity of the interface between the metal oxide layer 513 and the insulating layer 527 as illustrated in FIG.

22, the metal oxide layer 512 can be separated from the trap states Et526 and Et527 owing to the existence of the metal oxide layers 511 and 513.

Note that when a difference in energy between Ec511 and Ec512 is small, an electron in the metal oxide layer 512 might reach the trap state Et526 by passing over the difference in energy. Since the electron is trapped at the trap state Et526, negative fixed charge is generated at the interface with the insulating film, causing the threshold voltage of the transistor to be shifted in a positive direction. The same applies to the case where a difference in energy between Ec511 and Ec512 is small.

Each of the difference in energy between Ec511 and Ec512 and the difference in energy between Ec512 and Ec513 is preferably greater than or equal to 0.1 eV, more preferably greater than or equal to 0.15 eV so that a change in the threshold voltage of the OS transistor 501 can be reduced and the OS transistor 501 can have favorable electrical characteristics.

<Structure Example 2 of OS Transistor>

The OS transistor 502 in FIGS. 16A to 16C is a modification example of the OS transistor 501. The conductive layer 550 of the OS transistor 502 includes a conductive layer 550*a*, a conductive layer 550*b*, and a conductive layer 550*c*.

The conductive layer 550*a* is preferably formed by thermal CVD, MOCVD, or ALD. In particular, the conductive layer 550*a* is preferably formed by ALD. When the conductive layer 550*a* is formed by ALD or the like, plasma damage to the insulating layer 527 can be reduced. In addition, the conductive layer 550*a* is preferably formed by ALD or the like because coverage thereof can be improved. Therefore, it is possible to provide the highly reliable OS transistor 502.

The conductive layer 550*b* is formed using a material that has high conductivity, such as tantalum, tungsten, copper, or aluminum. The conductive layer 550*c* formed over the conductive layer 550*b* is preferably formed using a conductor that is less likely to be oxidized, such as tungsten nitride. In the case where an oxide material from which oxygen is released is used for the insulating layer 528, the conductive layer 550 can be prevented from being oxidized by released oxygen. Thus, it is possible to suppress oxidation of the conductive layer 550 and efficiently supply oxygen released from the insulating layer 528 to the oxide layer 510.

When a conductor that is less likely to be oxidized is used for the conductive layer 550*c* having a large contact area with the insulating layer 528 including an excess oxygen region, it is possible to suppress absorption of excess oxygen in the insulating layer 528 by the conductive layer 550. In addition, when a conductor with high conductivity is used for the conductive layer 550*b*, it is possible to provide the OS transistor 502 with low power consumption.

<Structure Example 3 of OS Transistor>

The OS transistor 503 in FIGS. 17A to 17C is a modification example of the OS transistor 501. In the OS transistor 503, the conductive layer 550 is used as an etching mask to etch the metal oxide layer 513 and the insulating layer 527.

<Structure Example 4 of OS Transistor>

The OS transistor 504 in FIGS. 18A to 18C is a modification example of the OS transistor 501.

The conductive layer 550 has a two-layer structure of the conductive layer 550*a* and the conductive layer 550*b*. The conductive layer 550 is covered with an insulating layer 530.

For example, the insulating layer 530 has an oxygen barrier property. Thus, oxygen released from the insulating layer 528 or the like can suppress oxidation of the conductive layer 550. In that case, a metal oxide such as aluminum oxide can be used for the insulating layer 530. The thickness of the insulating layer 530 is not limited to a certain thickness as long as oxidation of the conductive layer 550 can be prevented. For example, the thickness of the insulating layer 530 is greater than or equal to 1 nm and less than or equal to 10 nm, preferably greater than or equal to 3 nm and less than or equal to 7 nm.

Note that as in the case of the OS transistor 503, the metal oxide layer 513 and the insulating layer 527 in the OS transistor 504 may be partly removed so that upper surfaces of the conductive layers 551 and 552 are partly exposed. Alternatively, only the insulating layer 527 may be partly removed.

<Structure Example 5 of OS Transistor>

The OS transistor 505 in FIGS. 19A to 19C is a modification example of the OS transistor 501.

The conductive layer 551 has a two-layer structure of a conductive layer 551*a* and a conductive layer 551*b*, and the conductive layer 552 has a two-layer structure of a conductive layer 552*a* and a conductive layer 552*b*.

In the conductive layer 551, the conductive layers 551*a* and 552*a* are preferably formed using a conductive film that has high adhesion to the metal oxide layer 512. This conductive film is preferably formed by ALD because coverage thereof can be improved. The conductive layers 551*b* and 552*b* are preferably formed using a conductor that has higher conductivity than the conductive layers 551*a* and 552*a*. The use of the conductive layers 551*a* and 552*a* reduces restrictions on a conductive material that can be used for the conductive layers 551*b* and 552*b*. When a material that has high conductivity, such as tantalum, tungsten, copper, or aluminum, is used for the conductive layers 551*a* and 552*a*, power consumption of a circuit including the OS transistor 505 can be reduced.

<Structure Example 6 of OS Transistor>

The OS transistor 506 in FIGS. 20A to 20C is a modification example of the OS transistor 501. The OS transistor 506 differs from the OS transistor 501 mainly in the structure of the gate electrode.

The metal oxide layer 513, the insulating layer 527, and the conductive layer 550 are provided in an opening portion formed in the insulating layer 528. In other words, a gate electrode can be formed in a self-aligning manner by using the opening portion in the insulating layer 528. Thus, in the OS transistor 506, a gate electrode (550) does not include a region that overlaps with a source electrode and a drain electrode (551 and 552) with a gate insulating layer (527) positioned therebetween. Accordingly, gate-source parasitic capacitance and gate-drain parasitic capacitance can be reduced and frequency characteristics can be improved. Furthermore, gate electrode width can be controlled by the opening portion in the insulating layer 528; thus, it is easy to fabricate an OS transistor with short channel length.

<Structure Example 7 of OS Transistor>

The OS transistor 507 in FIGS. 21A to 21C is a modification example of the OS transistor 506.

The oxide layer 510 further includes a metal oxide layer 514. The metal oxide layer 514 covers the metal oxide layers 511 and 512 and the conductive layers 551 and 552.

The metal oxide layer 512 is separated from the insulating layer 528 by the metal oxide layer 514. In the oxide layer 510, a channel is mainly formed in the metal oxide layer 512; thus, generation of a shallow level in the vicinity of the channel can be suppressed when there is no region where the metal oxide layer 512 is in contact with the insulating layer 528. Thus, reliability of the OS transistor 507 can be improved.

<Structure Example of Semiconductor Device>

A structure example of a semiconductor device including OS transistors and Si transistors is described with reference to FIG. 23.

Figure 23:
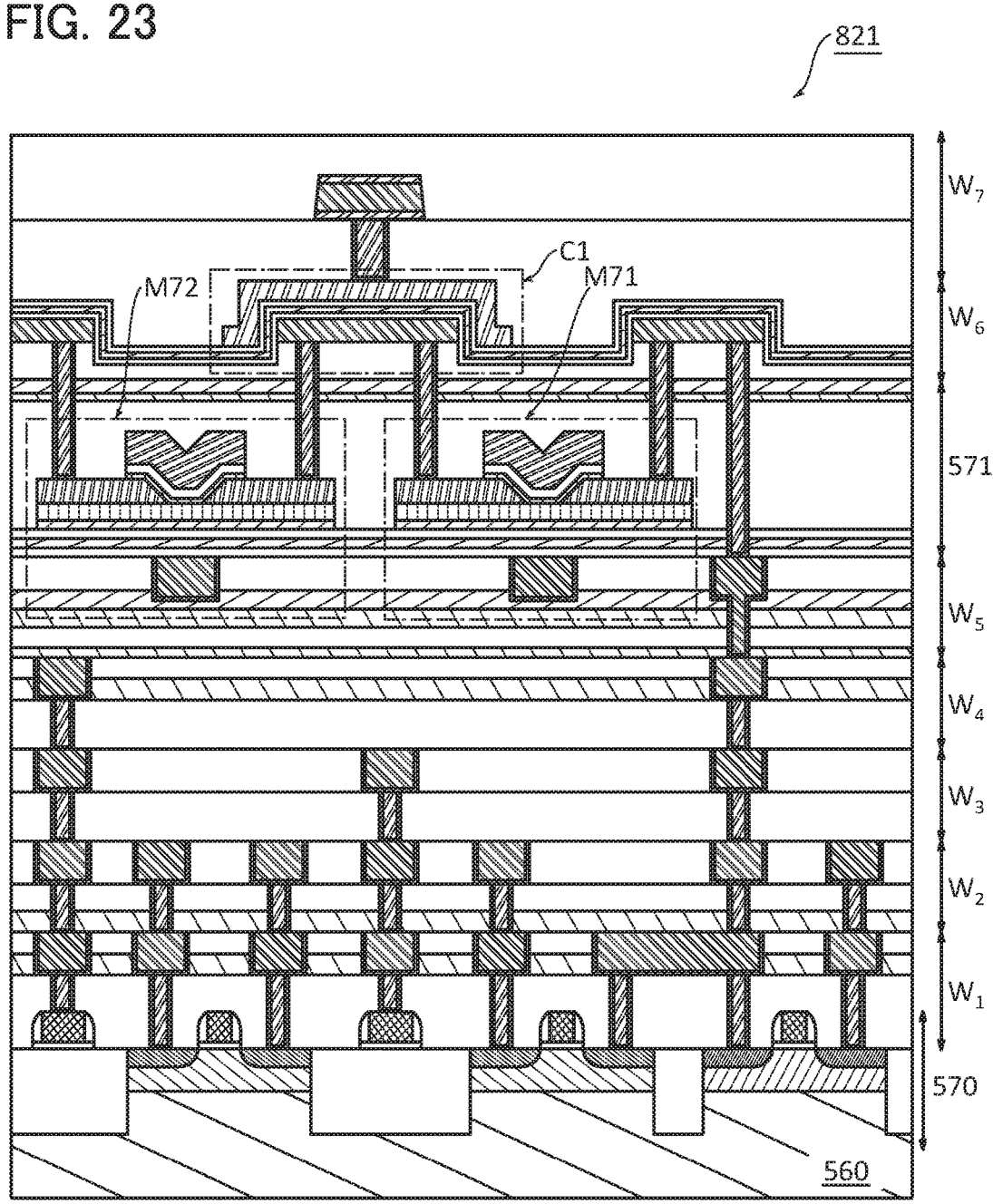
FIG. 23 is a cross-sectional view illustrating a structure example of a semiconductor device.

FIG. 23 is a cross-sectional view for illustrating the layered structure of the flip-flop 821 (FIG. 11).

The flip-flop 821 includes a stack of a CMOS layer 570, wiring layers $W_1$ to $W_5$, an OSFET layer 571, and wiring layers $W_6$ and $W_7$.

Si transistors of the flip-flop 821 are provided in the CMOS layer 570. An active layer of the Si transistor is formed using a single crystalline silicon wafer 560.

OS transistors of the flip-flop 821 are provided in the OSFET layer 571. In FIG. 23, the transistors M71 and M72 of the flip-flop 821 (the backup circuit 822) are typically illustrated. The transistors M71 and M72 have device structures similar to that of the OS transistor 503 (FIGS. 17A to 17C). The back gates of these transistors are formed in the wiring layer $W_5$. The capacitor C71 of the backup circuit 822 is provided in the wiring layer $W_6$.

Embodiment 8

In this embodiment, an oxide semiconductor is described. An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

A CAAC-OS is an oxide semiconductor having a plurality of c-axis aligned crystal parts (also referred to as pellets).

The CAAC-OS has c-axis alignment, its crystal parts (nanocrystals) are connected in an a-b plane direction, and the crystal structure has distortion. The size of the crystal part is greater than or equal to 1 nm, or greater than or equal to 3 nm. For this reason, the crystal part of the CAAC-OS can be referred to as a nanocrystal, and the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

The impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, oxygen vacancies in the oxide semiconductor serve as carrier traps or serve as carrier generation sources when hydrogen is captured therein.

<nc-OS>

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different crystal parts in the nc-OS. Thus, the orientation of the whole film is not observed. Since there is no regularity of crystal orientation between the crystal parts (nanocrystals), the nc-OS can also be referred to as an oxide semiconductor including random aligned nanocrystals (RANC) or an oxide semiconductor including non-aligned nanocrystals (NANC).

Since the crystal of the nc-OS does not have alignment, the nc-OS cannot be distinguished from an a-like OS or an amorphous oxide semiconductor in some cases depending on an analysis method.

The a-like OS has lower density than the nc-OS and the CAAC-OS. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. It is difficult to deposit an oxide semiconductor whose density is lower than 78% of the density of the single crystal oxide semiconductor.

For example, in the case of an oxide semiconductor with an atomic ratio of In:Ga:Zn=1:1:1, the density of single-crystal InGaZnO$_4$ with a rhombohedral crystal structure is 6.357 g/cm$^3$. Thus, for example, in the case of the oxide semiconductor with an atomic ratio of In:Ga:Zn=1:1:1, the density of an a-like OS is higher than or equal to 5.0 g/cm$^3$ and lower than 5.9 g/cm$^3$. In addition, for example, in the case of the oxide semiconductor with an atomic ratio of In:Ga:Zn=1:1:1, the density of an nc-OS or a CAAC-OS is higher than or equal to 5.9 g/cm$^3$ and lower than 6.3 g/cm$^3$.

Note that in the case where single crystals with the same composition do not exist, by combining single crystals with different compositions at a given proportion, it is possible to estimate density that corresponds to the density of a single crystal with a desired composition. The density of the single crystal with a desired composition may be estimated using weighted average with respect to the combination ratio of the single crystals with different compositions. Note that it is preferable to combine as few kinds of single crystals as possible for density estimation.

As described above, oxide semiconductors have various structures and various properties. An oxide semiconductor may be a stacked film including two or more of an amorphous oxide semiconductor, an a-like OS, an nc-OS, and a CAAC-OS, for example. The structure of the oxide semiconductor can be identified by X-ray diffraction (XRD), nanobeam electron diffraction, observation with a transmission electron microscope (TEM), or the like.

<Carrier Density of Oxide Semiconductor>

Next, the carrier density of an oxide semiconductor is described. Examples of a factor affecting the carrier density of an oxide semiconductor include oxygen vacancy (Vo) and impurities in the oxide semiconductor.

As the amount of oxygen vacancy in the oxide semiconductor increases, the density of defect states increases when hydrogen is bonded to the oxygen vacancy (this state is also referred to as VoH). The density of defect states also increases with an increase in the amount of impurity in the oxide semiconductor. Hence, the carrier density of an oxide semiconductor can be controlled by controlling the density of defect states in the oxide semiconductor.

The carrier density of the oxide semiconductor is preferably reduced in order to inhibit the negative shift of Vth of the OS transistor or reduce the off-state current of the OS transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state.

The carrier density of the oxide semiconductor is preferably increased in some cases in order to increase the on-state current or field-effect mobility of the OS transistor. The carrier density of the oxide semiconductor can be increased by slightly increasing the impurity concentration or the density of defect states in the oxide semiconductor. For example, an oxide semiconductor that has a slightly high impurity concentration or a slightly high density of defect states in the range where a favorable ratio between the on-state current and the off-state current (i.e., Ion/Ioff ratio) of the OS transistor is obtained can be regarded as being substantially intrinsic.

Furthermore, an oxide semiconductor that has high electron affinity and thus has a narrow bandgap so as to increase the density of thermally excited electrons (carriers) can be regarded as substantially intrinsic. Note that an OS transistor using an oxide semiconductor with higher electron affinity has lower Vth.

The oxide semiconductor with an increased carrier density has somewhat n-type conductivity; thus, it can be referred to as a "slightly-n" oxide semiconductor.

The carrier density of a highly purified intrinsic oxide semiconductor is, for example, lower than $8\times10^{15}$ cm$^{-3}$, preferably lower than $1\times10^{11}$ cm$^{-3}$, more preferably lower than $1\times10^{10}$ cm$^{-3}$ and higher than or equal to $1\times10^{-9}$ cm$^{-3}$.

The carrier density of a substantially highly purified intrinsic oxide semiconductor is, for example, higher than or equal to $1\times10^{5}$ cm$^{-3}$ and lower than $1\times10^{18}$ cm$^{-3}$, preferably higher than or equal to $1\times10^{7}$ cm$^{-3}$ and lower than or equal to $1\times10^{17}$ cm$^{-3}$, more preferably higher than or equal to $1\times10^{9}$ cm$^{-3}$ and lower than or equal to $5\times10^{16}$ cm$^{-3}$, still more preferably higher than or equal to $1\times10^{10}$ cm$^{-3}$ and lower than or equal to $1\times10^{16}$ cm$^{-3}$, yet more preferably higher than or equal to $1\times10^{11}$ cm$^{-3}$ and lower than or equal to $1\times10^{15}$ cm$^{-3}$.

REFERENCE NUMERALS

101: sensor system, 102: sensing device, 103: sensing device controller, 104: vibration power generator, 105: battery controller, 106: battery, 107: memory, 108: CPU, 109: clock generator, 110: bus, 111: timer, 112: baseband processing circuit, 113: PSW controller, 114: RF reception circuit, 115: RF transmission circuit, 116: antenna, 117: PSW, 118: PSW, 119: PSW, 120: PSW, 121: PSW, 122: PSW, 123: PSW, 124: signal processing portion, 151: sensor system, 152: display controller, 153: reflective display, 401: operator, 402: package, 403: slip, 404: sensor system, 405: refrigerator car, 451: motor vehicle, 452: air conditioner, 453: vent, 454: vent, 455*a*: sensor system, 455*b*: sensor system, 501: OS transistor, 502: OS transistor, 503: OS transistor, 504: OS transistor, 505: OS transistor, 506: OS transistor, 507: OS transistor, 510: oxide layer, 511: metal oxide layer, 512: metal oxide layer, 513: metal oxide layer, 514: metal oxide layer, 521: insulating layer, 522: insulating layer, 523: insulating layer, 524: insulating layer, 525: insulating layer, 526: insulating layer, 527: insulating layer, 528: insulating layer, 529: insulating layer, 530: insulating layer, 550: conductive layer, 550*a*: conductive layer, 550*b*: conductive layer, 550*c*: conductive layer, 551: conductive layer, 551*a*: conductive layer, 551*b*: conductive layer, 552: conductive layer, 552*a*: conductive layer, 552*b*: conductive layer, 553: conductive layer, 553*a*: conductive layer, 553*b*: conductive layer, 560: single crystal silicon wafer, 570: CMOS layer, 571: OSFET layer, 600: memory cell, 603: memory cell, 604: memory cell, 605: memory cell, 606: memory cell, 610: memory cell, 611: memory cell, 700: memory, 701: peripheral circuit, 710: memory cell array, 721: row decoder, 722: word line driver circuit, 730: bit line driver circuit, 731: column decoder, 732: precharge circuit, 733: sense amplifier, 734: write circuit, 740: output circuit, 760: control logic circuit, 821: flip-flop, 822: backup circuit, 823: scan flip-flop, 825: selector, 826: flip-flop, 900: vibration power generator, 901: fixed substrate, 902: movable substrate, 903: fixed electrode, 904: counter electrode, 905: electret, 906: spring, 7000: electronic component, 7001: lead, 7002: printed wiring board, 7004: circuit board, 7100: semiconductor wafer, 7102: circuit region, 7104: separated region, 7106: separation line, and 7110: chip.

This application is based on Japanese Patent Application serial No. 2016-035307 filed with Japan Patent Office on Feb. 26, 2016, the entire contents of which are hereby incorporated by reference.

The invention claimed is:

1. A semiconductor device comprising:
   a power generator;
   a wireless device;
   a sensing device configured to perform sensing;
   a sensing device controller;
   a power switch;
   a power switch controller; and
   a memory,
   wherein the memory includes a transistor whose channel formation region includes an oxide semiconductor,
   wherein the power switch and the power switch controller are configured to power off the sensing device controller and the memory when the sensing is not performed,
   wherein data obtained by the sensing device is transmitted through the wireless device, and wherein the sensing device uses power generated in the power generator.

2. The semiconductor device according to claim 1, wherein the power generator is a vibration power generator.

3. The semiconductor device according to claim 1, further comprising a timer,
wherein the timer is powered off during sensing.

4. The semiconductor device according to claim 1, further comprising an analog-digital converter circuit.

5. The semiconductor device according to claim 4, further comprising a CPU,
wherein the power switch and the power switch controller power off the CPU when the sensing is not performed.

6. The semiconductor device according to claim 5, wherein the CPU includes a transistor whose channel formation region includes an oxide semiconductor.

7. The semiconductor device according to claim 4, further comprising an image display device.

8. A vehicle comprising the semiconductor device according to claim 1.

9. The semiconductor device according to claim 1, further comprising a power storage device.

10. The semiconductor device according to claim 1, wherein the memory is a nonvolatile memory.

11. A sensor system comprising:
a power generator;
a wireless device;
a sensing device configured to perform sensing;
a sensing device controller;
a power switch;
a power switch controller; and
a memory,
wherein the memory includes a transistor whose channel formation region includes an oxide semiconductor,
wherein the power switch and the power switch controller are configured to power off the sensing device controller and the memory when the sensing is not performed,
wherein data obtained by the sensing device is transmitted through the wireless device,
wherein the sensing device uses power generated in the power generator, and
wherein at least one of temperature, humidity, atmospheric pressure, a light wavelength, light quantity, acceleration, and a gas concentration is obtained by the sensing device.

12. The sensor system according to claim 11, wherein the power generator is a vibration power generator.

13. The sensor system according to claim 11, further comprising a timer,
wherein the timer is powered off during sensing.

14. The sensor system according to claim 11, further comprising an analog-digital converter circuit.

15. The sensor system according to claim 14, further comprising a CPU,
wherein the power switch and the power switch controller power off the CPU when the sensing is not performed.

16. The sensor system according to claim 14, further comprising an image display device.

17. The sensor system according to claim 11, further comprising a power storage device.

18. The sensor system according to claim 11, wherein the memory is a nonvolatile memory.

* * * * *